United States Patent
Yamamoto et al.

(10) Patent No.: US 10,703,209 B2
(45) Date of Patent: Jul. 7, 2020

(54) VEHICLE AND WIRELESS POWER TRANSMISSION SYSTEM

(71) Applicant: Panasonic Intellectual Property Management Co., Ltd., Osaka (JP)

(72) Inventors: Hiroshi Yamamoto, Osaka (JP); Satoru Kikuchi, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 181 days.

(21) Appl. No.: 15/847,929

(22) Filed: Dec. 20, 2017

(65) Prior Publication Data

US 2018/0178660 A1    Jun. 28, 2018

(30) Foreign Application Priority Data

Dec. 22, 2016  (JP) ................................. 2016-249101

(51) Int. Cl.
*H02J 50/05*    (2016.01)
*B60L 11/18*    (2006.01)
(Continued)

(52) U.S. Cl.
CPC ........... *B60L 11/1809* (2013.01); *B60L 5/005* (2013.01); *B60L 9/00* (2013.01); *B60L 50/53* (2019.02);
(Continued)

(58) Field of Classification Search
CPC .......... B60L 11/1809; B60L 9/00; H02J 50/05
(Continued)

(56) References Cited

U.S. PATENT DOCUMENTS

2009/0284218 A1* 11/2009 Mohammadian ........ H01Q 7/00
320/107
2010/0201314 A1*  8/2010 Toncich .................. H02J 50/12
320/108
(Continued)

FOREIGN PATENT DOCUMENTS

EP       2 902 251 A2   8/2015
JP     2005-168232 A    6/2005
(Continued)

OTHER PUBLICATIONS

Extended European Search Report dated Apr. 10, 2018 for corresponding application No. 17208828.8.

*Primary Examiner* — Adi Amrany

(74) *Attorney, Agent, or Firm* — Renner, Otto, Boisselle & Sklar, LLP

(57) ABSTRACT

A vehicle to be driven by electric power which is wirelessly transmitted from a power transmitter having two transmission electrodes includes: two reception electrodes to receive AC power from the two transmission electrodes through capacitive coupling respectively with the two transmission electrodes; a power receiving circuit which is connected to the two reception electrodes to convert AC power received by the two reception electrodes into DC power or another form of AC power, and supply the DC power or other form of AC power to an electric motor which drives the vehicle; and a control circuit which, while the vehicle is traveling over the two transmission electrodes, increases an impedance of the vehicle as viewed from the power transmitter when a value of at least one of power, voltage and current in the power receiving circuit, or a change rate over time thereof, exceeds a threshold value.

17 Claims, 21 Drawing Sheets

(51) Int. Cl.
- *H02J 7/02* (2016.01)
- *B60L 5/00* (2006.01)
- *B60L 53/22* (2019.01)
- *B60L 53/00* (2019.01)
- *B60L 50/53* (2019.01)
- *B60L 9/00* (2019.01)
- *H03H 7/38* (2006.01)
- *H02P 1/16* (2006.01)
- *H02P 3/06* (2006.01)

(52) U.S. Cl.
CPC ............... *B60L 53/00* (2019.02); *B60L 53/22* (2019.02); *H02J 7/025* (2013.01); *H02J 50/05* (2016.02); *H03H 7/38* (2013.01); *B60L 2200/44* (2013.01); *H02P 1/16* (2013.01); *H02P 3/06* (2013.01); *Y02P 90/60* (2015.11); *Y02T 10/7005* (2013.01); *Y02T 10/7072* (2013.01); *Y02T 90/127* (2013.01); *Y02T 90/14* (2013.01)

(58) Field of Classification Search
USPC .................................................. 307/9.1, 10.1
See application file for complete search history.

(56) References Cited

U.S. PATENT DOCUMENTS

| | | | |
|---|---|---|---|
| 2012/0313450 A1* | 12/2012 | Nam | H02J 17/00 307/104 |
| 2014/0232185 A1* | 8/2014 | Sempel | H02J 50/12 307/11 |
| 2014/0361639 A1 | 12/2014 | Ichikawa et al. | |
| 2016/0072311 A1 | 3/2016 | Kato | |
| 2016/0164307 A1 | 6/2016 | Shibata et al. | |
| 2016/0294217 A1* | 10/2016 | Mi | H02J 50/90 |
| 2017/0141583 A1* | 5/2017 | Adolf | H04B 5/0037 |
| 2018/0095468 A1* | 4/2018 | Yang | B64C 39/024 |

FOREIGN PATENT DOCUMENTS

| | | |
|---|---|---|
| JP | 2010-028898 A | 2/2010 |
| WO | WO 2015/037526 A1 | 3/2015 |
| WO | WO 2015/053246 A1 | 4/2015 |
| WO | WO 2016/017750 A1 | 2/2016 |

* cited by examiner

VEHICLE AND WIRELESS POWER TRANSMISSION SYSTEM

BACKGROUND

1. Field of the Invention

The present disclosure relates to a vehicle that is driven by electric power which is wirelessly transmitted thereto, and relates also to a wireless power transmission system.

2. Description of the Related Art

In recent years, wireless power transmission techniques for wirelessly (contactlessly) transmitting electric power to devices that are capable of moving or being moved, e.g., mobile phones and electric vehicles, have been being developed. Wireless power transmission techniques include methods based on electromagnetic induction and methods based on electric field coupling. Among these, a wireless power transmission system based on the electric field coupling method is such that, while a pair of transmission electrodes and a pair of reception electrodes are opposed to each other, AC power is wirelessly transmitted from the pair of transmission electrodes to the pair of reception electrodes. A wireless power transmission system based on such an electric field coupling method may be used for the purpose of transmitting electric power to a load (e.g., a motor or a battery in a vehicle such as a mobile robot) from a pair of transmission electrodes that are provided on the road surface (or on the floor surface). International Publication No. 2015/037526 (hereinafter "Patent Document 1") discloses an example of a wireless power transmission system based on such an electric field coupling method.

SUMMARY

In a wireless power transmission system based on the electric field coupling method, when a vehicle travels near a pair of transmission electrodes that are provided on the road surface, etc., electric power is transmitted from the transmission electrodes to the vehicle. However, if the power transmitter has already been transmitting electric power to another ("first") vehicle, the efficiency of power transmission to this first vehicle will decrease as a second vehicle travels near the transmission electrode.

The present disclosure provides a novel technique which, even if a second vehicle happens to travel near transmission electrodes, does not allow much decrease in the efficiency of power transmission to a first vehicle which has already been being charged.

In order to solve the above problems, a vehicle according to one implementation of the present disclosure, to be driven by electric power which is wirelessly transmitted from a power transmitter having two transmission electrodes, comprises:

two reception electrodes to receive AC power from the two transmission electrodes through capacitive coupling respectively with the two transmission electrodes;

a power receiving circuit which is connected to the two reception electrodes to convert AC power received by the two reception electrodes into DC power or another form of AC power, and supply the DC power or other form of AC power to an electric motor which drives the vehicle or to a secondary battery which stores electric power for driving the vehicle; and a first control circuit which, while the vehicle is moving with the two reception electrodes being opposed to the two transmission electrodes, increases an impedance of the vehicle as viewed from the power transmitter in response to an instruction that the electric power from the power transmitter is not to be received.

General or specific aspects of the present disclosure may be implemented using a system, a method, an integrated circuit, a computer program, or a storage medium, or any combination of a system, an apparatus, a method, an integrated circuit, a computer program, and/or a storage medium.

With the technique according to the present disclosure, it is possible to suppress decrease in the efficiency of power transmission from the transmission electrodes to a first vehicle even if a second vehicle happens to travel near the transmission electrodes.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIG. 6 is a flowchart showing an example of motor drive controlling for the transport robot 10a.

FIG. 7B is a diagram schematically showing the location of switch circuits 270, each including a switch to turn ON or OFF electrical connection, in a transport robot 10a.

FIG. 9 is a flowchart showing an example of power-receiving circuit controlling in the transport robot 10a.

FIG. 10 is a flowchart showing another example of motor drive controlling in the transport robot 10a.

FIG. 11 is a flowchart showing another example of power-receiving circuit controlling in the transport robot 10a.

DETAILED DESCRIPTION

Findings Providing the Basis of the Present Disclosure

Prior to describing embodiments of the present disclosure, findings providing the basis of the present disclosure will be described.

Figure 1:
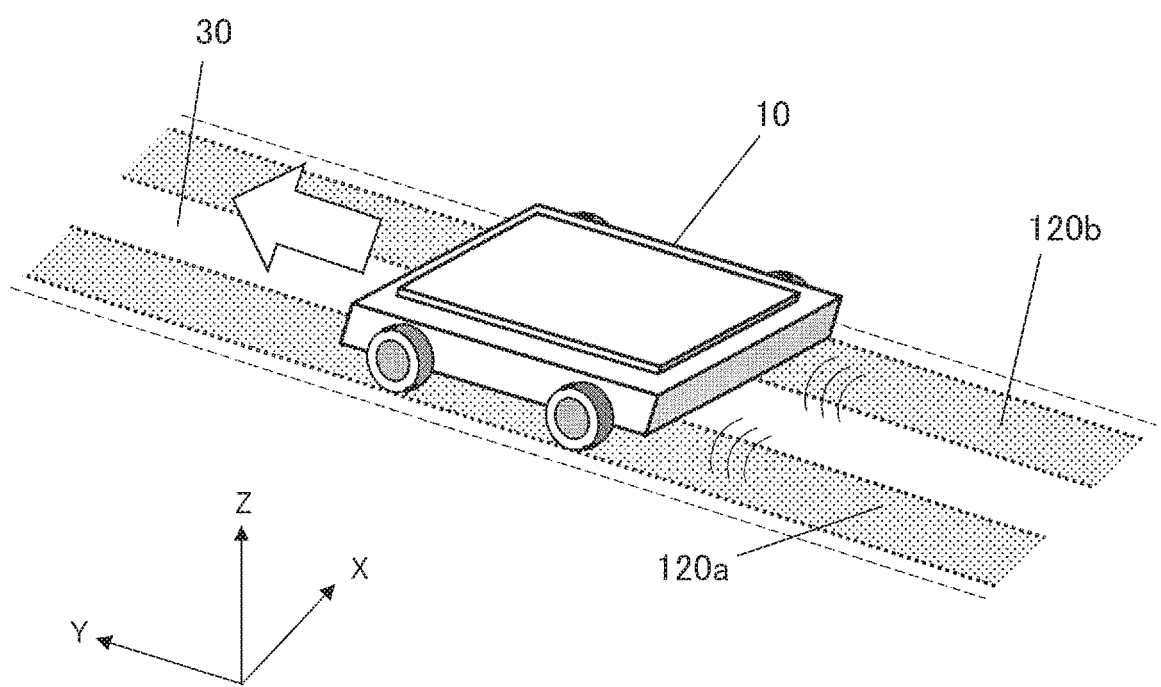
FIG. 1 is a diagram schematically showing an example of a wireless power transmission system based on the electric field coupling method, as conceived by the inventors.

FIG. 1 is a diagram schematically showing an example of a wireless power transmission system based on the electric field coupling method as conceived by the inventors. The wireless power transmission system shown in the figure may be a system which wirelessly transmits electric power to a transport robot (automated guided vehicle: AGV) 10 that is used in transporting articles in a factory, for example. The transport robot 10 is an example of a vehicle according to the present disclosure. In this system, a pair of transmission electrodes 120a and 120b, which are in plate shape, are disposed on the road surface (floor surface) 30. The transport robot 10 includes a pair of reception electrodes (not shown) opposing the pair of transmission electrodes 120a and 120b. With the pair of reception electrodes, the transport robot 10 receives AC power which has been transmitted from the transmission electrodes 120a and 120b. The received electric power is supplied to a load in the transport robot 10, e.g., a motor, a secondary battery, or a capacitor for electrical storage purposes. With this, the transport robot 10 may be driven or charged.

FIG. 1 shows XYZ coordinates indicating the X, Y and Z directions which are orthogonal to one another. The following description will rely on XYZ coordinates as shown in the figures. The direction that the transmission electrodes 120a and 120b extend will be referred to as the Y direction; a direction which is perpendicular to the surface of the transmission electrodes 120a and 120b as the Z direction; and a direction which is perpendicular to the Y direction and the Z direction as the X direction. Note that the orientation of any structure that is shown in a drawing of the present application is so set for ease of description, and it shall not limit the orientation in which an embodiment of the present disclosure may actually be employed. Moreover, the particular shape and size with which the whole or a part of any structure may be presented in a drawing shall not limit its actual shape and size.

Figure 2:
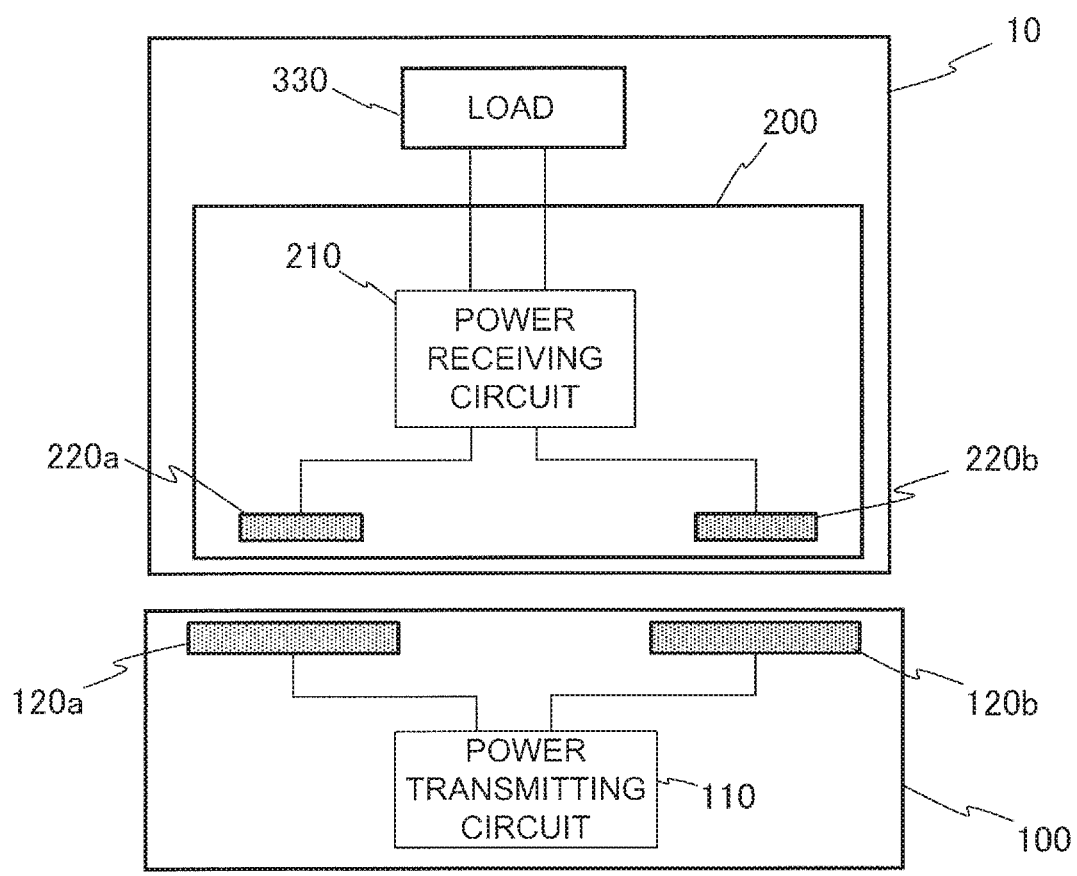
FIG. 2 is a diagram showing a general construction for the wireless power transmission system shown in FIG. 1.

FIG. 2 is a diagram showing a general construction for the wireless power transmission system shown in FIG. 1. This wireless power transmission system includes a power transmitter 100 and a transport robot (vehicle) 10. The power transmitter 100 includes a pair of transmission electrodes 120a and 120b, and a power transmitting circuit 110 which supplies AC power to the transmission electrodes 120a and 120b. The power transmitting circuit 110 is, for example, an AC output circuit including an inverter circuit. The power transmitting circuit 110 converts DC power which is supplied from a DC power source not shown into AC power, and outputs it to the pair of transmission electrodes 120a and 120b.

The transport robot 10 includes a power receiver 200 and a load 330. The power receiver 200 includes a pair of reception electrodes 220a and 220b and a power receiving circuit 210 which converts the AC power that is received by the reception electrodes 220a and 220b into electric power as desired by the load 330 (e.g., DC voltage of a predetermined voltage or AC power of a predetermined frequency) and supplies it to the load 330. The power receiving circuit 210 may include various circuits such as a rectifier circuit or a frequency conversion circuit. The load 330 may be any device that consumes or stores electric power, e.g., a motor, a capacitor for electrical storage purposes, or a secondary battery. Through electric field coupling (capacitive coupling) between the pair of transmission electrodes 120a and 120b and the pair of reception electrodes 220a and 220b, electric power is wirelessly transmitted while the two pairs are opposed to each other.

With such a wireless power transmission system, the transport robot 10 is able to wirelessly receive electric power while moving along the transmission electrodes 120a and 120b. While the transmission electrodes 120a and 120b and the reception electrodes 220a and 220b remain in a closely opposed state, the transport robot 10 moves in a direction that the transmission electrodes 120a and 120b extend (i.e., the Y direction in FIG. 1). As a result, the transport robot is able to move while allowing a means of electrical storage, e.g., a capacitor, to be charged.

However, the following problem may occur when a plurality of vehicles (e.g., transport robots) simultaneously move and are simultaneously charged in such a wireless power transmission system. While a first vehicle is being charged, if a second vehicle travels over the transmission electrodes 120a and 120b, part of the energy that has been sent out from the transmission electrodes 120a and 120b will be received by the second vehicle, thereby lowering the efficiency of power transmission to the first vehicle.

The inventors have found the aforementioned problem, and sought for constructions for solving this problem. Consequently, the inventors have succeeded in solving the above problem based on embodiments of the present disclosure as will be described below.

A vehicle according to one implementation of the present disclosure is a vehicle to be driven by electric power which is wirelessly transmitted from a power transmitter having two transmission electrodes, the vehicle comprising:

two reception electrodes to receive AC power from the two transmission electrodes through capacitive coupling respectively with the two transmission electrodes;

a power receiving circuit which is connected to the two reception electrodes to convert AC power received by the two reception electrodes into DC power or another form of AC power, and supply the DC power or other form of AC power to an electric motor which drives the vehicle or to a secondary battery which stores electric power for driving the vehicle; and a first control circuit which, while the vehicle is moving with the two reception electrodes being opposed to the two transmission electrodes, increases an impedance of the vehicle as viewed from the power transmitter in response to an instruction that the electric power from the power transmitter is not to be received.

In the above implementation, the vehicle includes a first control circuit which, while the vehicle is traveling near the two transmission electrodes, increases the impedance of the vehicle as viewed from the power transmitter in response to an instruction from the power transmitter that the electric power is not to be received.

As a result, even if the vehicle travels near the transmission electrodes, decrease in the efficiency of power transmission from the transmission electrodes to another vehicle is suppressed.

The vehicle may further comprise a second control circuit which acquires information on at least one of a status of electric power transmission from the power transmitter to the vehicle, location of the vehicle, and remaining power of the secondary battery, determines whether or not electric power from the power transmitter is to be received based on the information, and sends the instruction to the first control circuit when determining that the electric power is not to be received.

By comprising the second control circuit, the vehicle in itself is able to determine whether electric power is to be received or not, and when necessary, increases the impedance of the vehicle as viewed from the power transmitter. As a result, even if the vehicle travels near the transmission electrodes, decrease in the efficiency of power transmission from the transmission electrodes to another vehicle is suppressed.

The "status of electric power transmission from the power transmitter to the vehicle" may include, for example, information on a value of at least one of power, voltage and current in the power receiving circuit of the vehicle, or a change rate over time thereof.

The second control circuit may send the instruction to the first control circuit when a value of at least one of power, voltage and current in the power receiving circuit, or a change rate over time thereof, exceeds a threshold value.

In one embodiment, the value of at least one of power, voltage and current in the power receiving circuit, or the change rate over time thereof, is greater than the threshold value when the power transmitter is transmitting power to another vehicle distinct from the vehicle. The value of at least one of power, voltage and current in the power receiving circuit, or the change rate over time thereof, is not greater than the threshold value when the power transmitter is not transmitting power to another vehicle distinct from the vehicle.

While the two reception electrodes are opposed respectively to the two transmission electrodes, if a predetermined amount of time has elapsed before the value of at least one of power, voltage and current in the power receiving circuit, or the change rate over time thereof, exceeds the threshold value, the first control circuit may request the power transmitter for power transmission.

When a predetermined amount of time has elapsed before the value of at least one of power, voltage and current in the power receiving circuit, or the change rate over time thereof, exceeds a threshold value, it is presumable that no other vehicle exists which is receiving electric power supplied from the power transmitter. Therefore, in such a case, the first control circuit may request the power transmitter for power transmission. In response to this request, the power transmitter may increase the transmission power.

The present disclosure encompasses a wireless power transmission system (also referred to as a "vehicle system") that includes a power transmitter, one or more vehicles, and a central controller which controls the power transmitter and the one or more vehicles. The central controller performs wireless communication between the power transmitter and the one or more vehicles, thereby controlling them. The vehicle may perform the aforementioned impedance control in response to an instruction from the central controller.

In other words, upon receiving the aforementioned instruction from the central controller which controls the vehicle(s) and the power transmitter, the first control circuit may increase the impedance of the vehicle as viewed from the power transmitter.

In one embodiment, the central controller acquires information on at least one of a status of electric power transmission from the power transmitter to the vehicle, location of the vehicle, and remaining power of the secondary battery, determines whether or not the vehicle is to receive the electric power from the power transmitter based on the information, and when determining that the electric power from the power transmitter is not to be received from the vehicle, sends the instruction to the first control circuit.

In such an embodiment, from the power transmitter and/or the vehicle, the central controller may acquire information on at least one of a status of electric power transmission, location of the vehicle, and remaining power of the secondary battery, via wireless communication, for example.

In the present disclosure, a "vehicle" is not limited to a wheeled vehicle such as the aforementioned transport robot, but encompasses any movable object that is driven by electric power. Examples of vehicles may include an electric vehicle that includes an electric motor and one or more wheels. Such a vehicle may be an automated guided vehicle (AGV) such as the aforementioned transport robot, an electric vehicle (Electric Vehicle: EV), or an electric cart, for example. The "vehicle" within the meaning of the present disclosure also encompasses any movable object that lacks wheels. For example, bipedal robots, unmanned aerial vehicles (UAV, or so-called drones) such as multicopters, and manned electric aircraft are also examples of "vehicles".

Hereinafter, more specific embodiments of the present disclosure will be described. Note however that unnecessarily detailed descriptions may be omitted. For example, detailed descriptions on what is well known in the art or redundant descriptions on what is substantially the same construction may be omitted. This is to avoid lengthy description, and facilitate the understanding of those skilled in the art. The accompanying drawings and the following description, which are provided by the present inventors so that those skilled in the art can sufficiently understand the present disclosure, are not intended to limit the scope of claims. In the following description, identical or similar constituent elements are denoted by identical reference numerals.

Embodiment 1

First, an illustrative first embodiment of the present disclosure will be described. In the present embodiment, when a status of electric power transmission from a power transmitter to a vehicle matches a predetermined condition, the vehicle determines that electric power from the power transmitter is not to be received. More specifically, when a value of at least one of power, voltage and current in a power receiving circuit, or a change rate over time thereof, exceeds a threshold value, the vehicle increases the impedance of the vehicle as viewed from the power transmitter, so that electric power from the power transmitter will not be received. This suppresses decrease in the efficiency of power transmission to another vehicle.

Figure 3:
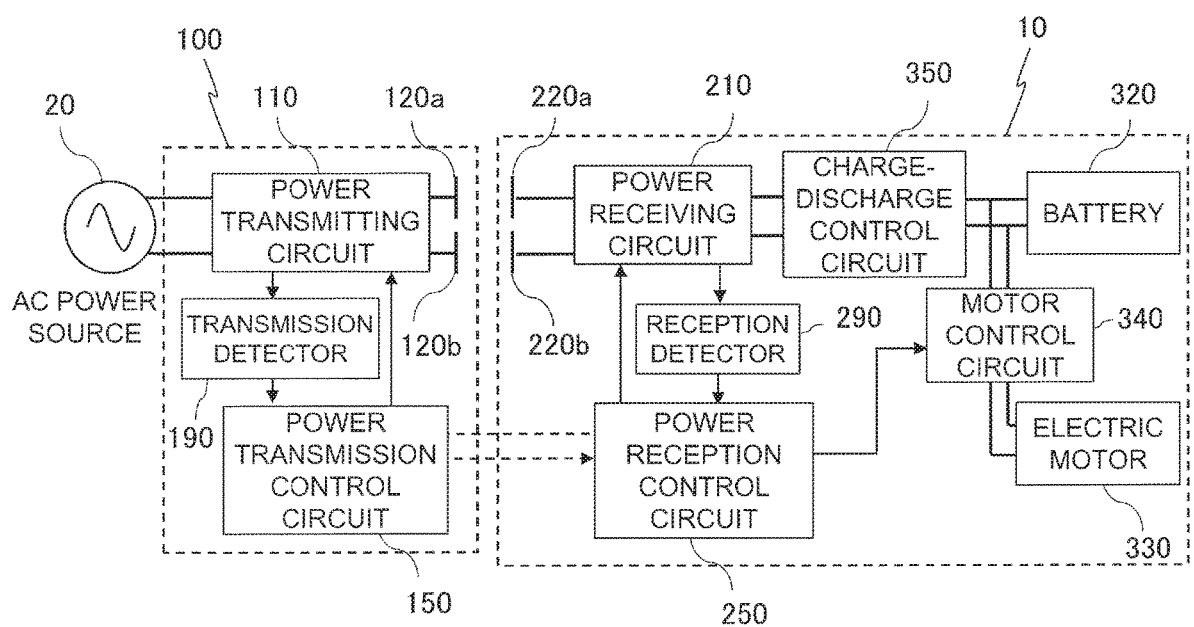
FIG. 3 is a diagram showing a construction for a power transmitter 100 and a transport robot (vehicle) 10 in a wireless power transmission system according to an embodiment of the present disclosure.

FIG. 3 is a diagram showing a construction for a power transmitter 100 and a transport robot (as one example of a vehicle) 10 in a wireless power transmission system according to an embodiment of the present disclosure.

The power transmitter 100 includes a power transmitting circuit 110, a pair of transmission electrodes 120a and 120b, a transmission detector 190, and a power transmission control circuit 150. The external AC power source 20 supplies AC power to the power transmitting circuit 110. The power transmitting circuit 110 may include a converter circuit and an inverter circuit. The AC power which is supplied to the power transmitting circuit 110 is converted by the converter circuit into DC power. Thereafter, the DC power is converted by the inverter circuit into another form of AC power. The pair of transmission electrodes 120a and 120b are connected to the power transmitting circuit 110. The pair of transmission electrodes 120a and 120b wirelessly transmit the AC power which is output from the power transmitting circuit 110. The transmission detector 190 detects a power, voltage, current, or the like at a specific site in the power transmitting circuit 110. In the present embodiment, as one example, the transmission detector 190 detects a current which is output from the inverter circuit in the power transmitting circuit 110. The transmission detector 190 sends data representing the detected value thereof to the power transmission control circuit 150. The power transmission control circuit 150 sends a command based on this information to the power transmitting circuit 110.

On the other hand, the transport robot 10 includes a power receiving circuit 210, a pair of reception electrodes 220a and 220b, a reception detector 290, a power reception control circuit 250, an electric motor 330 (which may hereinafter be simply referred to as the "motor 330"), a motor control circuit 340, a charge-discharge control circuit 350, and a secondary battery 320 (which may hereinafter be simply referred to as the "battery 320"). The pair of reception electrodes 220a and 220b establish capacitive coupling with their respective counterparts in the pair of transmission electrodes 120a and 120b. The pair of reception electrodes 220a and 220b receive AC power from the pair of transmission electrodes 120a and 120b. The power receiving circuit 210 is connected to the pair of reception electrodes 220a and 220b. The power receiving circuit 210 may include a rectifier circuit, with which the power receiving circuit 210 converts the AC power which is received by the pair of reception electrodes 220a and 220b into DC power. The power receiving circuit 210 may convert the received AC power into another form of AC power.

The power receiving circuit 210 supplies the converted electric power to the electric motor 330 and/or the battery 320, which drive the transport robot 10. Charging and discharging of the battery 320 is controlled by the charge-discharge control circuit 350. The reception detector 290 detects power, voltage, current, or the like at a specific site in the power receiving circuit 210 (e.g., immediately after a rectifier circuit). In the present embodiment, as one example, the reception detector 290 detects a current which is output from the rectifier circuit in the power receiving circuit 210. The power receiving circuit 210 sends data representing the detected value thereof to the power reception control circuit 250. The power reception control circuit 250 sends a command based on this information to the power receiving circuit 210 and the motor control circuit 340. In accordance with this command, the motor control circuit 340 starts or stops the electric motor 350. In accordance with the driving method of the electric motor 350, the motor control circuit 340 may include a converter circuit or an inverter circuit. In the present embodiment, the motor control circuit 340 corresponds to a first control circuit, whereas the power reception control circuit 250 corresponds to a second control circuit.

The power reception control circuit 250 acquires information on the status of electric power transmission from the power transmitter 100 to the vehicle 10 and remaining power of the battery 320, and based on this information, determines whether electric power from the power transmitter 100 is to be received or not. When determining that electric power is not to be received, the power reception control circuit 250 sends to the motor control circuit 340 an instruction that electric power is not to be received. Upon receiving this instruction, the motor control circuit 340 stops the motor 330, thereby increasing the impedance of the vehicle 10 as viewed from the power transmitter 100.

The power transmission control circuit 150 of the power transmitter 100 and the power reception control circuit 250 of the transport robot 10 are able to communicate with each other wirelessly.

In the following description, the transmission electrodes 120a and 120b may be indiscriminately expressed as "transmission electrodes 120". Similarly, the reception electrodes 220a and 220b may be indiscriminately expressed as "reception electrodes 220". Moreover, a current/voltage/power as taken at a specific site in the power transmitting circuit 110 or the power receiving circuit 210 may simply be referred to as a "current/voltage/power in the power transmitting circuit 110 or the power receiving circuit 210".

Hereinafter, a fundamental operation according to the present embodiment will be described. First, an exemplary operation will be described where, while the transport robot travels over the transmission electrodes 120, there is no other transport robot above the transmission electrodes 120.

Figure 4A:
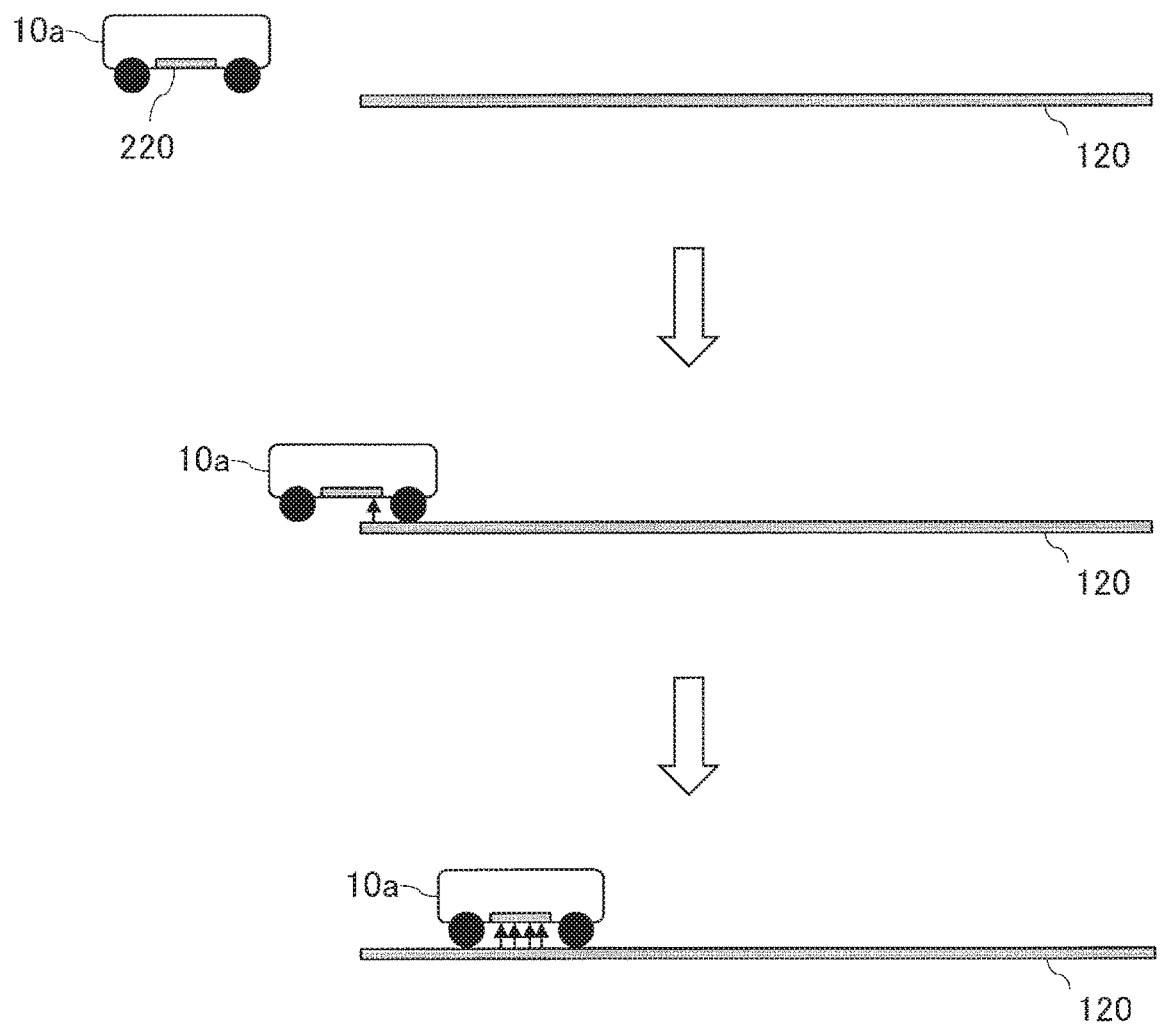
FIG. 4A is a diagram schematically showing change over time in the relative positioning of a transport robot 10a and transmission electrodes 120.

FIG. 4A is a diagram schematically showing change over time in the relative positioning of a transport robot 10a and transmission electrodes 120. Upward arrows schematically represent electric power which is supplied to the transport robot 10a. The number of upward arrows corresponds to the amount of received power. Downward blank arrows indicate lapse of time. Even when the transport robot 10a is not situated over the transmission electrodes 120 as shown in the uppermost illustration, i.e., the reception electrodes 220 of the transport robot 10 are not opposed to the transmission electrodes 120, the power transmitter 100 is constantly transmitting weak electric power from the transmission electrodes 120. The level of weak electric power is such that it does not affect the environment, but is also detectable by the circuitry on the reception side. When the traveling transport robot 10a begins to move over the transmission electrodes 120 as shown in the middle illustration, the transport robot 10a begins to receive the weak electric power from the transmission electrodes 120. At this time, since the transmitted power is weak, the power, voltage, and current that are output from the rectifier circuit in the power receiving circuit 210 of the transport robot 10a do not increase much from zero.

Therefore, if a predetermined amount of time has elapsed before the value of at least one of power, voltage and current in the power receiving circuit 210, or the change rate over time thereof, exceeds a threshold value, the power reception control circuit 250 of the transport robot 10a determines that no other transport robot exists over the transmission electrodes 120 that is receiving power.

Furthermore, on the basis of the current status of the load, the power reception control circuit 250 of the transport robot 10a determines whether or not there is need to receive power. "Need to receive power" exists when, for example, the remaining power in the battery 320 of the transport robot 10a is smaller than a predetermined value, etc. When the transport robot 10a has placed itself completely over the transmission electrodes 120 as indicated in the lowermost illustration of FIG. 4A, and if the power reception control circuit 250 of the transport robot 10a determines that there is need to receive power and that no other transport robot exists over the transmission electrodes 120 that is receiving power, the power reception control circuit 250 requests the power transmission control circuit 150 of the power transmitter 100 to give full transmission. Full transmission means transmission of relatively large electric power, through which the transport robot is provided with the power that it needs. The power under full transmission is larger than the power under weak transmission. Based on a command from the power transmission control circuit 150 having received a request for full transmission from the power reception control circuit 250, the power transmitting circuit 110 switches from weak transmission to full transmission.

Figure 4B:
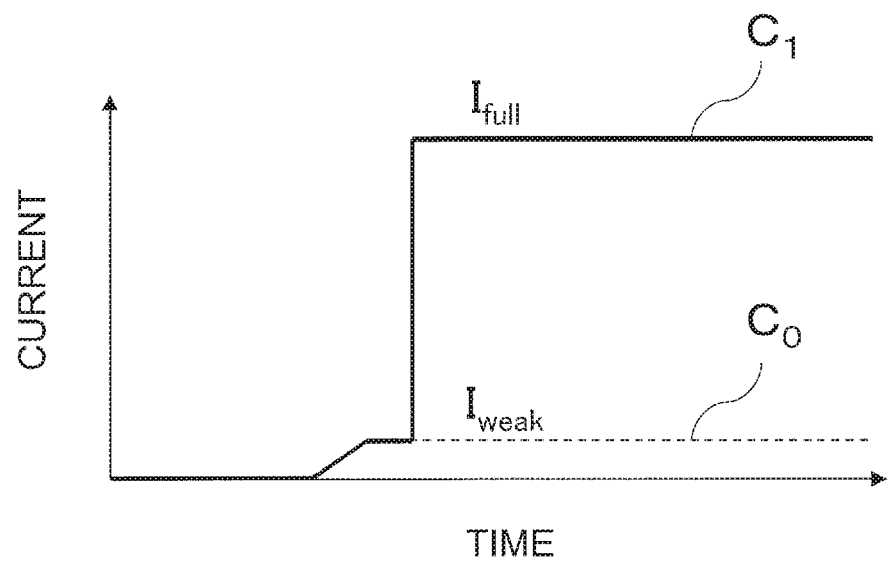
FIG. 4B is a diagram showing an example where a current in a power receiving circuit 210 of a transport robot 10a undergoes change over time.

FIG. 4B is a diagram showing an example change over time of a current in the power receiving circuit 210 of the transport robot 10a. As one example, a case of utilizing a detected value of a current that flows in the power receiving circuit 210 will be described. Instead of a current, a detected value of voltage or power in the power receiving circuit 210 may be utilized. In the example shown in the figure, the current to be detected in the power receiving circuit 210 is a DC current. In the case where the current to be detected in the power receiving circuit 210 is an AC current, the presence or absence of another transport robot may be determined based on change over time in the amplitude of the AC current. For simplicity, in the following description, a current in the power receiving circuit 210 will be depicted as linear changes. In actuality, the current in the power receiving circuit 210 may undergo changes that represent a curve, due to noise or transient response.

First, an exemplary operation where the transport robot 10a does not need to receive power will be described. In this case, the transport robot 10a continues to receive weak electric power from the transmission electrodes 120. When a portion of the reception electrodes 220 of the traveling transport robot 10a becomes opposed to the transmission electrodes 120, a current $C_0$ in the power receiving circuit 210 begins to increase from zero. As the transport robot 10a moves along the transmission electrodes 120, the move causes a gradual increase in the area of overlap between the transmission electrodes 120 and the reception electrodes 220, thereby also increasing the detected current. Once the entire reception electrodes 220 become opposed to the electrodes 120, the current $C_0$ in the power receiving circuit 210 has a value $I_{weak}$ which is governed by the status of the load and the transmission efficiency at that moment. When there is no need to receive power, the transport robot 10a does not request the power transmitter 100 for full transmission; therefore, as is indicated by a broken line in FIG. 4B, the current $C_0$ in the power receiving circuit 210 stays at the constant value $I_{weak}$.

Next, an exemplary operation in the case where the transport robot 10a needs to receive power (e.g., when there is little remaining battery power) will be described. In this case, the transport robot 10a requests the transmission electrodes 120 for full transmission. As the traveling transport robot 10a travels over the transmission electrodes 120, similarly to the case where there is no need to receive power, the output current $C_1$ from the power receiving circuit 210 increases from zero and reaches $I_{weak}$. At this time, if another transport robot exists over the transmission electrodes 120 that is being charged, this transmission power will also be received by the transport robot 10a. As a result of this, unlike in the example shown in FIG. 4B, the current $C_1$ in the power receiving circuit 210 of the transport robot 10a drastically increases to a value which is much higher than $I_{weak}$. On this account, when the value of the current $C_1$ exceeds a threshold value (e.g., a value which is equal to or greater than $I_{weak}$), it can be determined that another transport robot is being charged. Conversely, if a predetermined amount of time has elapsed before the value of the current $C_1$ exceeds the threshold value, the power reception control circuit 250 of the transport robot 10a may determine that no other transport robot exists over the transmission electrodes 120 that is receiving power. After making this determination, the power reception control circuit 250 of the transport robot 10a requests the power transmission control circuit 150 to begin full transmission. Once the power transmitting circuit 110 of the power transmitter 100 begins full transmission, the current $C_1$ in the power receiving circuit 210 drastically increases to reach a constant value $I_{full}$. For the sake of distinction between $I_{weak}$ and $I_{full}$, $I_{full}$ may be set to five times greater than $I_{weak}$, or even more, for example.

Figure 4C:
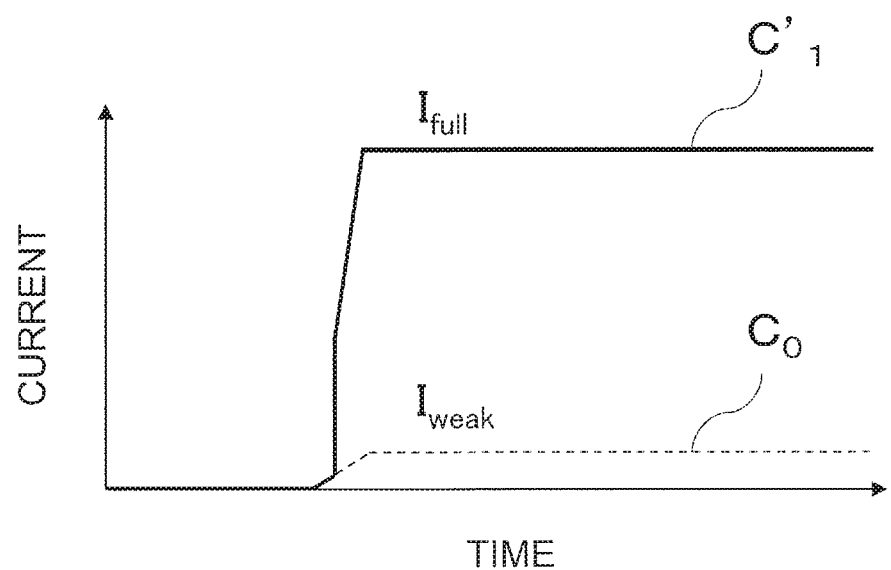
FIG. 4C is a diagram showing another example where a current in a power receiving circuit 210 of a transport robot 10a undergoes change over time.

FIG. 4C is a diagram showing another example where a current in the power receiving circuit 210 of the transport robot 10a undergoes change over time. If a predetermined amount of time has elapsed before the change rate over time of a current $C'_1$ in the power receiving circuit 210 exceeds a threshold value (e.g., the change rate over time concerning an amount of increase of the current $C_0$ from zero), the power reception control circuit 250 of the transport robot 10a may determine that no other transport robot exists over the transmission electrodes 120 that is receiving power. After making this determination, the power reception control circuit 250 of the transport robot 10a requests the power transmission control circuit 150 to begin power transmission. Once the power transmitting circuit 110 of the power transmitter 100 begins full transmission, the current $C'_1$ in the power receiving circuit 210 drastically increases. Thereafter, the current $C'_1$ in the power receiving circuit 210 undergoes a proportional increase, until reaching a constant value $I_{full}$. As compared to the case of making the determination based on a current value, determining the presence or absence of another transport robot based on the change rate over time of a current allows a signal requesting the power transmission control circuit 150 to begin full transmission to be sent more quickly.

After full transmission has begun, the transport robot 10a which is receiving power goes past the transmission electrodes 120. Then, the current in the power receiving circuit 210 begins to decrease from $I_{full}$, until finally reaching zero. Similarly, the current in the power transmitting circuit 110 also begins to decrease. As a result of this, the power transmission control circuit 150 is able to determine that the transport robot 10a has passed. After making this determination, with a command from the power transmission control circuit 150, the power transmitting circuit 110 switches from full transmission to weak transmission. In another method, while the transport robot 10a is passing over the transmission electrodes 120, the power reception control circuit 250 of the transport robot 10a may send a command to the power transmission control circuit 150 to switch from full transmission to weak transmission.

Next, with reference to FIG. 5A, an exemplary operation where another transport robot 10b exists on the transmission electrodes 120 while the transport robot 10a is traveling over the transmission electrodes 120 will be described. Once electric power begins to be supplied in part to the transport robot 10a, the electric power that is supplied to the other transport robot 10b that is also receiving power decreases, whereby the efficiency of power transmission to the transport robot 10b may be deteriorated. In order to avoid this situation, the transport robot 10a performs control to suppress power reception from the transmission electrodes 120.

Suppressing supply of electric power to the transport robot 10a corresponds to decreasing the current in the power receiving circuit 210 of the transport robot 10a. This is equivalent to increasing the impedance of the transport robot 10a as viewed from the power transmitter 100. One possible method of controlling the impedance of the transport robot 10a as viewed from the power transmitter 100 may be a method of controlling driving of the electric motor 330 in the transport robot 10a (which will be referred to as the motor drive controlling method).

Figure 5A:
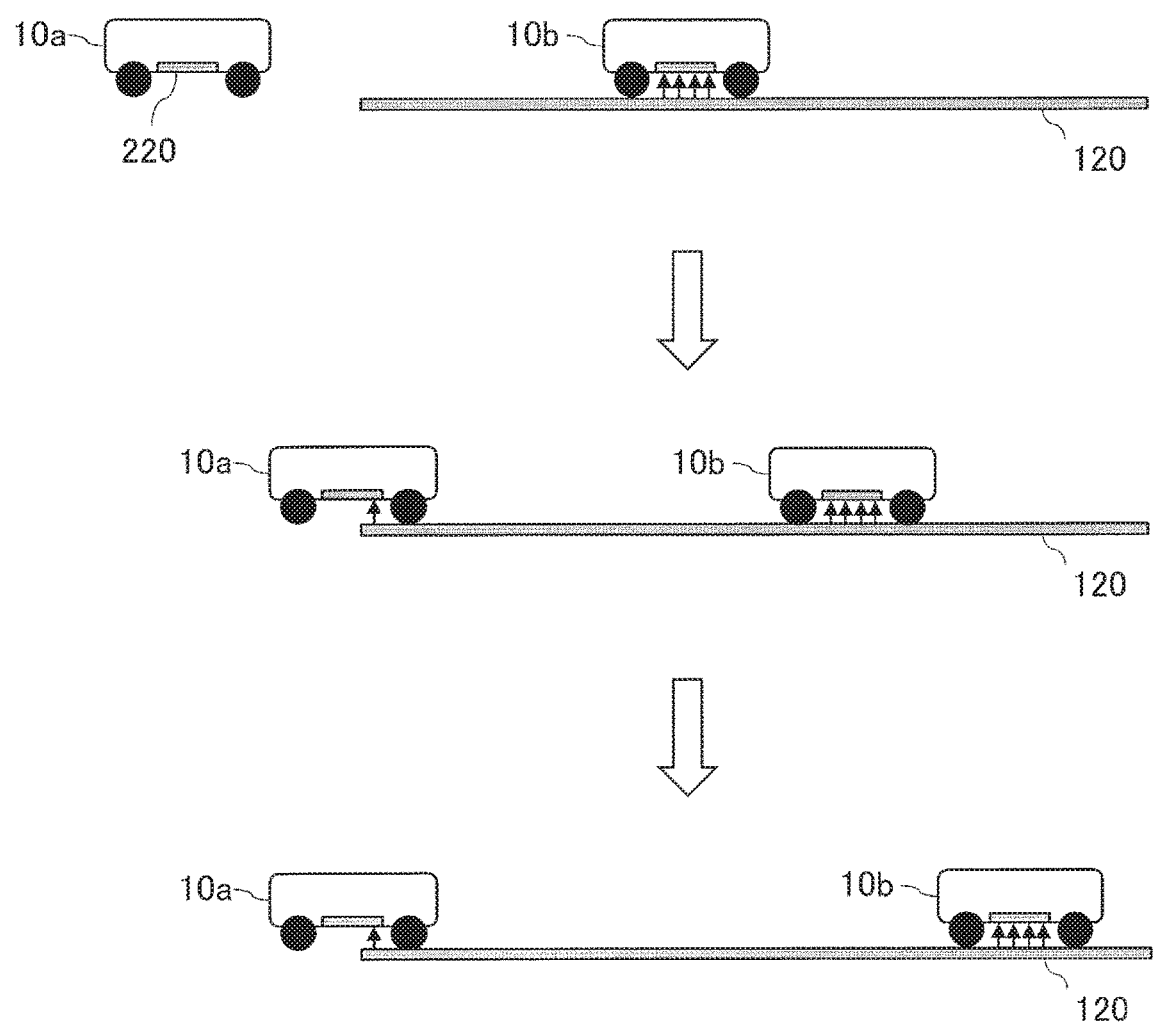
FIG. 5A is a diagram schematically showing change over time in the relative positioning of two transport robots 10a and 10b and transmission electrodes 120, under motor drive controlling.

FIG. 5A is a diagram schematically showing change over time in the relative positioning of two transport robots 10a and 10b, which perform control under the motor drive controlling method, and the transmission electrodes 120. As is indicated in the uppermost illustration of FIG. 5A, another transport robot 10b that is receiving power exists over the transmission electrodes 120. When the transport robot 10a travels over the transmission electrodes 120 as indicated in the middle illustration of FIG. 5A, the transport robot 10a receives electric power which is sent from the transmission electrodes 120. Since full transmission is being conducted, the current in the power receiving circuit 210 of the transport robot 10a drastically increases from zero. The current value and the change rate over time thereof are remarkably greater than those in the examples shown in FIG. 4B and FIG. 4C. Therefore, if the current value in the power receiving circuit 210 of the transport robot 10a or the change rate over time thereof exceeds a threshold value, the power reception control circuit 250 of the transport robot 10a may determine that another transport robot 10b exists over the transmission electrodes 120 that is receiving power. In that case, the power reception control circuit 250 of the transport robot 10a sends to the motor control circuit 340 a command to stop the electric motor 330. As is indicated in the lowermost illustration of FIG. 5A, with the command to stop the motor, the transport robot 10a makes a stop near the entry into the transmission electrodes 120. This makes it possible to suppress decrease in the efficiency of power transmission from the transmission electrodes 120 to another transport robot 10b.

Figure 5B:
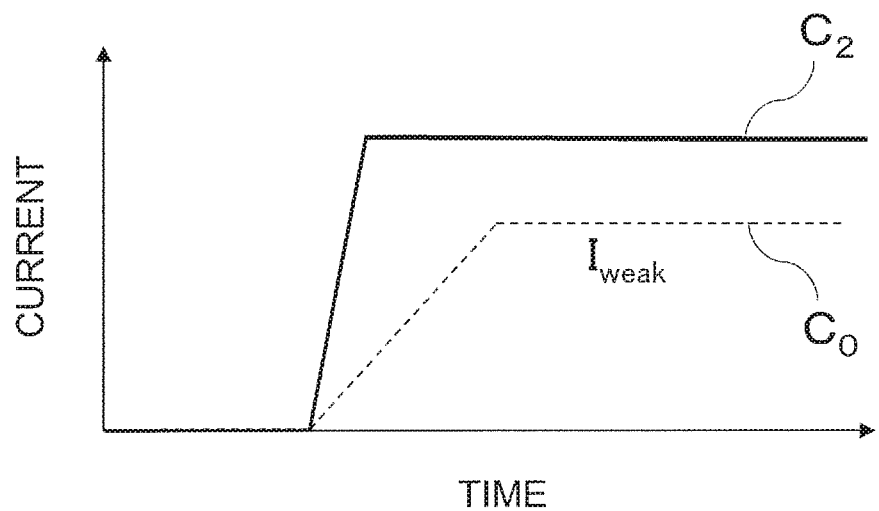
FIG. 5B is a diagram showing an example where a current in a power receiving circuit 210 of a transport robot 10a undergoes change over time, under motor drive controlling.

FIG. 5B is a diagram showing an example change over time of a current in the power receiving circuit 210 of the transport robot 10a, in the case where control under the motor drive controlling method is performed. In this example, a threshold value for the current in the power receiving circuit 210 is set to a value which is equal to or greater than $I_{weak}$.

A current $C_0$ in FIG. 5B depicts an example change over time in the current in the power receiving circuit 210 in the case where there is no need to receive power. This current corresponds the current $C_0$ shown in FIG. 4B, except for being represented in different scales therefrom as to time and current. As shown in FIG. 5B, when the traveling transport robot 10a travels over the transmission electrodes 120, a current $C_2$ in the power receiving circuit 210 undergoes a large increase as compared to the case where no other transport robot 10b exists. When this current exceeds the threshold value, the power reception control circuit 250 of the transport robot 10a sends to the motor control circuit 340 a command to stop the electric motor 330. In this case, the geometric area in which the transmission electrodes 120 and the reception electrodes 220 of the transport robot 10a are opposed ceases to increase and remains constant at a level which is sufficiently small relative to the maximum possible area. As a result of this, the current $C_2$ in the power receiving circuit 210 maintains at a constant value. This constant value is sufficiently smaller than the $I_{full}$ value which pertains to full transmission, and thus is expected to make the influences on the transport robot 10b sufficiently small. Making the current in the power receiving circuit 210 of the transport robot 10a sufficiently small is equivalent to increasing the impedance of the transport robot 10a as viewed from the power transmitter 100.

Figure 5C:
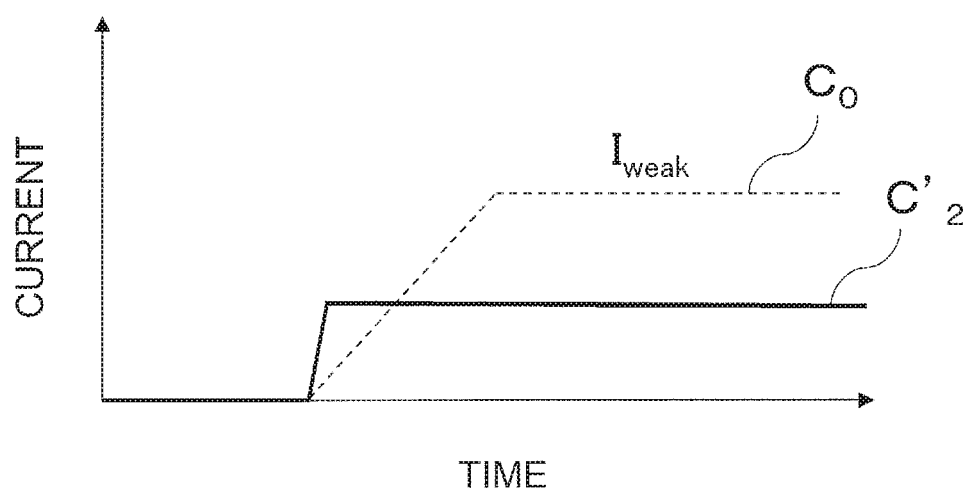
FIG. 5C is a diagram showing another example where a current in a power receiving circuit 210 of a transport robot 10a undergoes change over time, under motor drive controlling.

FIG. 5C is a diagram showing another example change over time of a current in the power receiving circuit 210 of the transport robot 10a in the case where control under the motor drive controlling method is performed. In this example, a change rate over time of the current $C_0$ existing before the current value in the power receiving circuit 210 reaches $I_{weak}$ is set as a threshold value. When the change rate over time of the current exceeds the threshold value, a command to stop the electric motor 330 is sent to the motor control circuit 340 of the transport robot 10a. As a result, a current $C'_2$ in the power receiving circuit 210 has a final value which is smaller than the value in the example of FIG. 5B. By making a determination based on the change rate over time of a current, a signal to stop the motor can be sent to the power receiving circuit 210 more quickly than in the case of making the determination based on a current value.

Next, an exemplary operation where the transport robot 10b goes past the transmission electrodes 120 after the motor in the transport robot 10a is stopped will be described. In this case, the power transmitter 100 switches from full transmission to weak transmission. At the same time, the current in the power receiving circuit 210 of the transport robot 10a begins to decrease from the constant value. For example, when the current $C_2$ in FIG. 5B has decreased to $I_{weak}$, the motor control circuit 340 of the transport robot 10a sends a command to the electric motor 330 to start. As a result of this, the transport robot 10a begins to travel again. In this case, it is evident that no transport robot 10b that is receiving power exists over the transmission electrodes 120. Therefore, only when power reception is necessary, the power reception control circuit 250 of the transport robot 10a sends a command to the power transmission control circuit 150 of the power transmitter 100 to switch from weak transmission to full transmission. A decrease in the current in the power receiving circuit 210 may be determined based on whether the current value in the power receiving circuit 210 or the change rate over time thereof has become lower than the threshold value or not. This threshold value may be different from the threshold value which is used in determining the presence or absence of another transport robot 10b over the transmission electrodes 120 that is receiving power.

Figure 6:
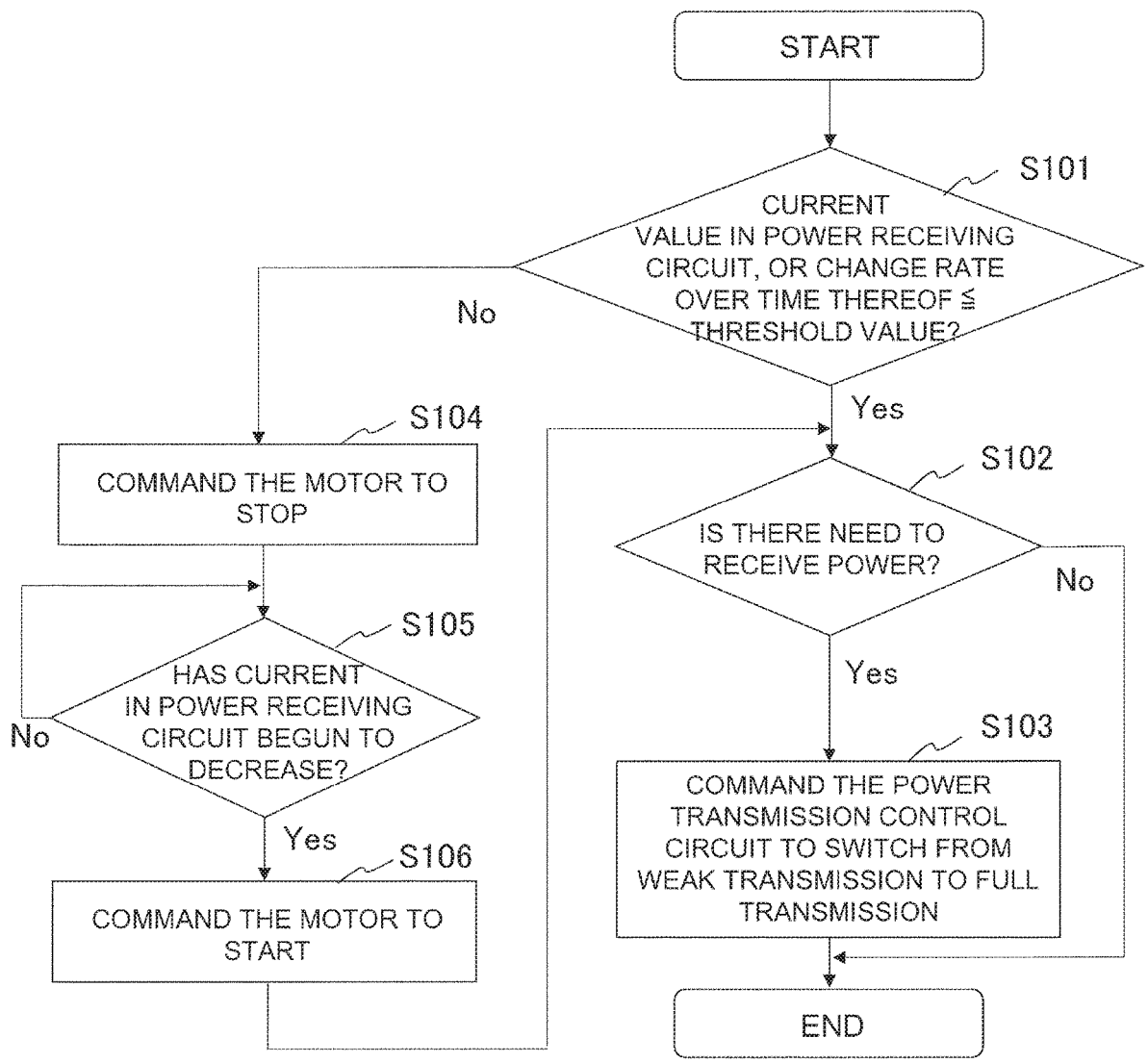

FIG. 6 is a flowchart showing an example of motor drive controlling for the transport robot 10a. The power reception control circuit 250 determines whether a predetermined amount of time has elapsed before the current value in the power receiving circuit 210 or the change rate over time thereof exceeds a threshold value (S101). If a predetermined amount of time has elapsed before the current value in the power receiving circuit 210 or the change rate over time thereof exceeds the threshold value, the power reception control circuit 250 determines whether there is need to receive power or not (S102). If there is need to receive power, the power reception control circuit 250 sends to the power transmission control circuit 150 a command to switch from weak transmission to full transmission (S103). On the other hand, when the current value in the power receiving circuit 210 or the change rate over time thereof has exceeded the threshold value, the power reception control circuit 250 sends a command to the electric motor 330 to stop via the motor control circuit 340 (S104). Thereafter, the power reception control circuit 250 determines whether the current in the power receiving circuit 210 has begun to decrease or not (S105). If the current in the power receiving circuit 210 has begun to decrease, the power reception control circuit 250 sends a command to the electric motor 330 to start (S106). Thereafter, the power reception control circuit 250 determines whether there is need to receive power or not (S102).

Other than the aforementioned motor drive controlling, as a method of controlling the impedance of the transport robot 10a as viewed from the power transmitter 100, a method which turns electrical connections ON or OFF in the power receiving circuit 210 of the transport robot 10a (which will be referred to as the "power-receiving circuit controlling method") may also be possible.

Figure 7A:
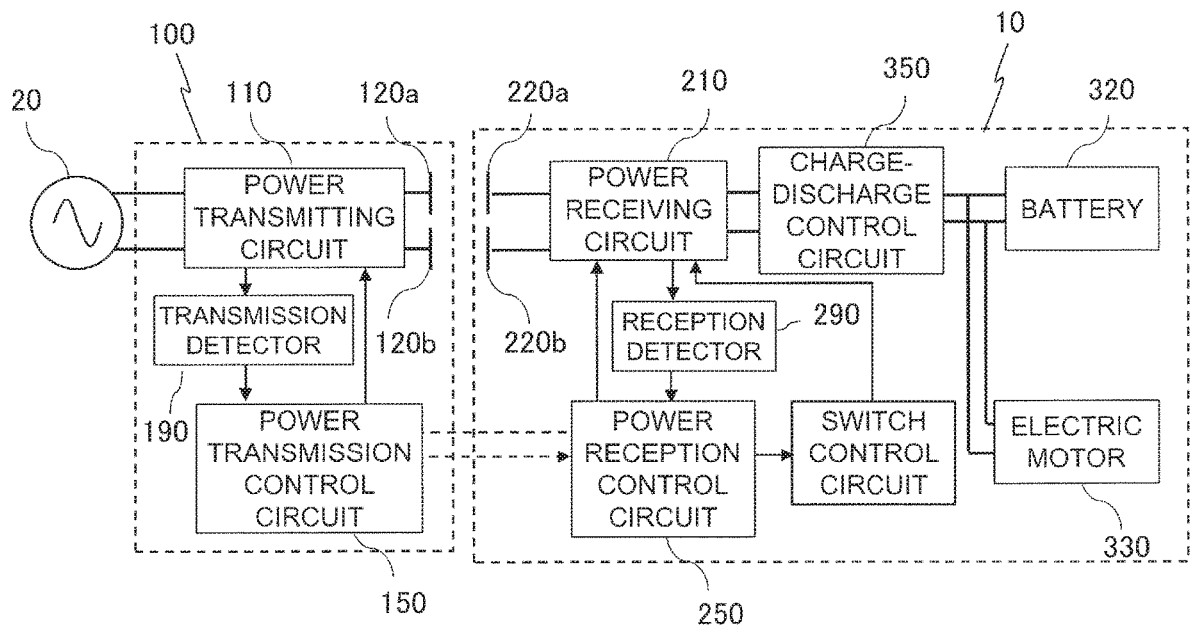
FIG. 7A is another diagram showing the construction of a power transmitter 100 and a transport robot 10 in a wireless power transmission system according to an embodiment of the present disclosure.

FIG. 7A is a diagram showing the construction of the power transmitter 100 and the transport robot 10 in a wireless power transmission system according to a variant of the present embodiment. The transport robot 10 includes a switch control circuit 255. The power receiving circuit 210 includes switches whose electrical connections can be turned ON or OFF. Upon receiving an instruction from the power reception control circuit 250, the switch control circuit 255 sends a command to turn ON or OFF the switch connections in the power receiving circuit 210. Although the power reception control circuit 250 and the switch control circuit 255 are illustrated as separate circuits in the present embodiment, a single circuit containing these circuits may be provided. In the example of FIG. 7A, the switch control circuit 255 corresponds to the first control circuit, whereas the power reception control circuit 250 corresponds to the second control circuit.

Figure 7B:
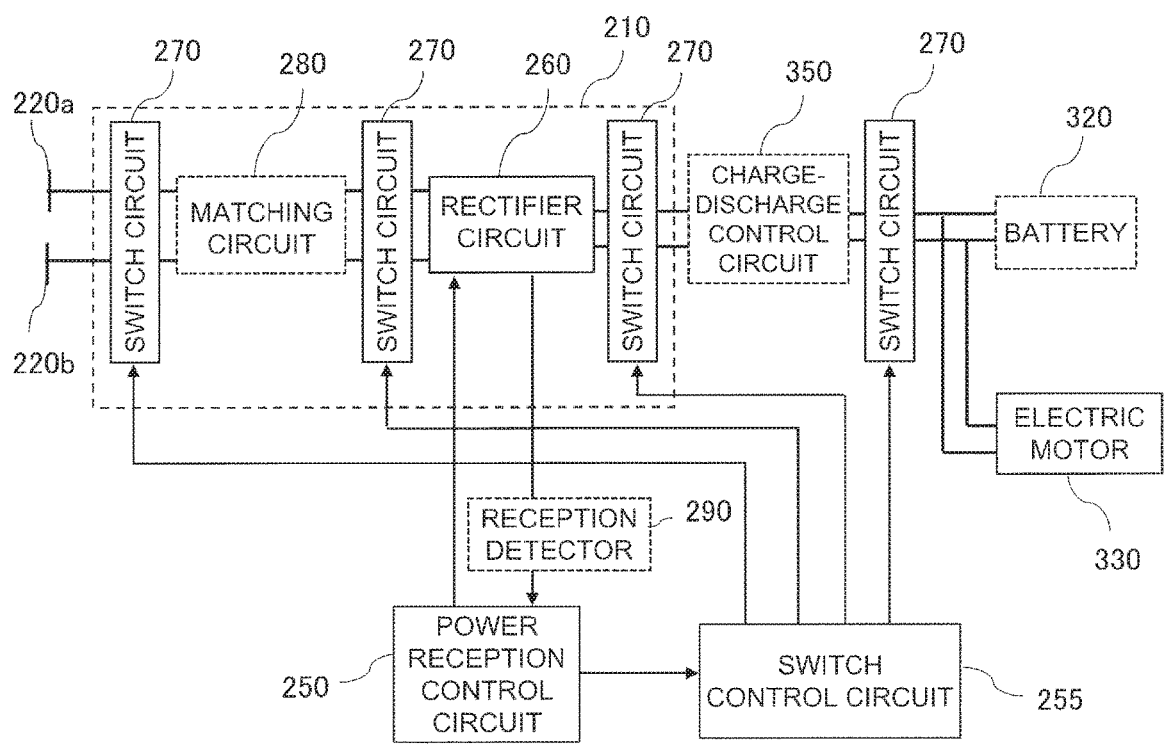

FIG. 7B is a diagram schematically showing an exemplary arrangement of switch circuits 270. In this example, the power receiving circuit 210 includes a matching circuit 280, a rectifier circuit 260, and a plurality of switch circuits 270. The switch circuits 270 are connected in at least one of the following places: between the reception electrodes 220 and the impedance matching circuit (hereinafter referred to as the "matching circuit") 280; between the matching circuit 280 and the rectifier circuit 260; between the rectifier circuit 260 and the charge-discharge control circuit 350; and between the charge-discharge control circuit 350 and the electric motor 330. In the present specification, the term "power receiving circuit" may allude to any circuitry that includes constituent elements between the reception electrodes 220 and the electric motor 330.

Figure 8A:
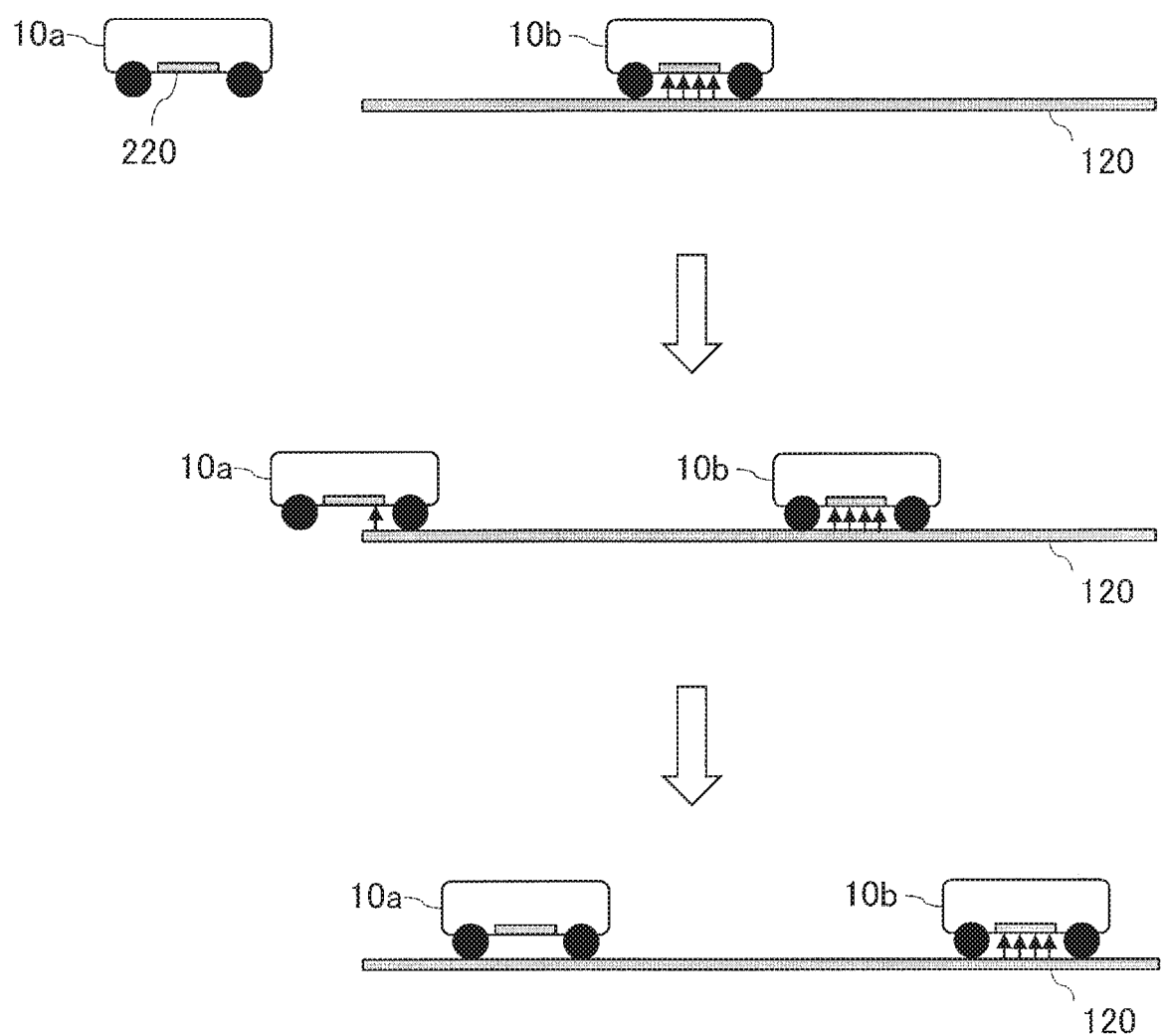
FIG. 8A is a diagram schematically showing change over time in the relative positioning of two transport robots 10a and 10b and transmission electrodes 120, under power-receiving circuit controlling.

FIG. 8A is a diagram schematically showing an example change over time in the relative positioning of two transport robots 10a and 10b and transmission electrodes 120, in the case where control under the power-receiving circuit controlling method is performed. As is indicated in the uppermost illustration of FIG. 8A, a transport robot 10b that is receiving power exists over the transmission electrodes 120. When the traveling transport robot 10a travels over the transmission electrodes 120, as is indicated in the middle illustration of FIG. 8A, the transport robot 10a begins to receive electric power from the transmission electrodes 120. In this case, since full transmission to another transport robot 10b is being conducted, the current in the power receiving circuit 210 of the transport robot 10a drastically increases from zero. Therefore, when the current value in the power receiving circuit 210 of the transport robot 10a or the change rate over time thereof exceeds a threshold value, the transport robot 10a may determine that another transport robot 10b that is receiving power exists over the transmission electrodes 120. At this time, the power reception control circuit 250 of the transport robot 10a sends to the power receiving circuit 210 a command to turn OFF the electrical connection of at least one switch, via the switch control circuit 255. Thus cuts the current path in the power receiving circuit 210, so that there is zero current in the power receiving circuit 210. As is indicated in the lowermost illustration of FIG. 8A, based on the command to the power receiving circuit 210, the transport robot 10a stops power reception. However, supply of power to its motor 330 can be continued. Thus, the transport robot 10a is able to continue traveling, while not affecting supply of power to the transport robot 10b. Unlike in the motor drive controlling method, without causing the transport robot 10a to stop, the power-receiving circuit controlling method is able to suppress decrease in the efficiency of power transmission from the transmission electrodes 120 to another transport robot 10b.

Figure 8B:
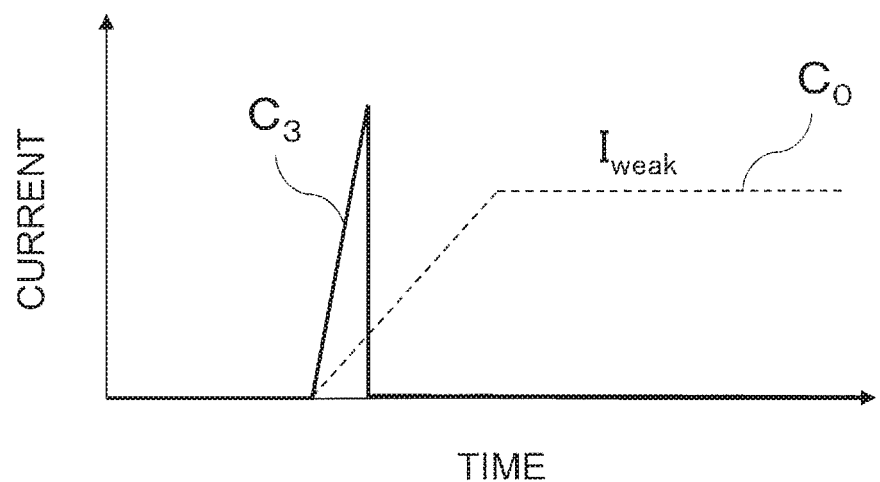
FIG. 8B is a diagram showing an example where a current in a power receiving circuit 210 of a transport robot 10a undergoes change over time, under power-receiving circuit controlling.

FIG. 8B is a diagram showing an example change over time of a current in the power receiving circuit 210 of the transport robot 10a, in the case where control under the power-receiving circuit controlling method is performed. In this example, a threshold value for the current is set to a value which is equal to or greater than $I_{weak}$. The current $C_0$ represents change over time of the current in the power receiving circuit 210 during weak transmission. This current corresponds to the current $C_0$ in the power receiving circuit 210 in FIG. 5B. As shown in FIG. 8B, as the transport robot 10a travels over the transmission electrodes 120, the current $C_3$ in the power receiving circuit 210 greatly increases from zero, as compared to how it was during weak transmission. When the current $C_3$ in the power receiving circuit 210 exceeds the threshold value, the switch control circuit 255 of the transport robot 10a sends to the power receiving circuit 210 a command to turn OFF the electrical connection of at least one switch, so that there is zero current in the power receiving circuit 210. There being zero current flowing in the power receiving circuit 210 is equivalent to the impedance of the transport robot 10a as viewed from the power transmitter 100 being increased to infinity.

Figure 8C:
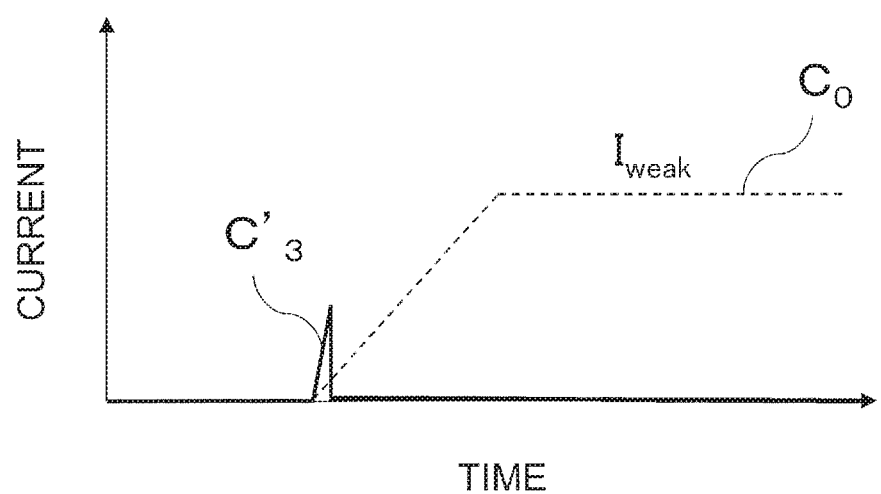
FIG. 8C is a diagram showing another where a current in a power receiving circuit 210 of a transport robot 10a undergoes change over time, under power-receiving circuit controlling.

FIG. 8C is a diagram showing another example change over time of a current in the power receiving circuit 210 of the transport robot 10a in the case where control under the power-receiving circuit controlling method is performed. In this example, the change rate over time of the current $C_0$ during weak transmission, before the current value reaches $I_{weak}$, is set as a threshold value. When the change rate over time of this current exceeds the threshold value, the power reception control circuit 250 of the transport robot 10a sends to the power receiving circuit 210 a command to turn OFF electrical connection, via the switch control circuit 255. As a result, the current $C'_3$ in the power receiving circuit 210 becomes zero. By making a determination based on the change rate over time of a current, a signal to turn OFF electrical connection can be sent to the power receiving circuit 210 of the transport robot 10a more quickly than in the case of making the determination based on a current value.

After a predetermined amount of time has elapsed since electrical connection was turned OFF, the switch control circuit 255 of the transport robot 10a sends a command to turn ON electrical connection in the power receiving circuit 210. The aforementioned predetermined amount of time may be set to a period of time at which the transport robot 10b will presumably have gone past the transmission electrodes 120 so that the power transmitter 100 will have returned to weak transmission from full transmission. With the above command, the transport robot 10a traveling over the transmission electrodes 120 again begins to receive electric power from the transmission electrodes 120. Thereafter, the power reception control circuit 250 of the transport robot 10a again determines the presence or absence of any transport robot 10b over the transmission electrodes 120 that is receiving power.

Figure 9:
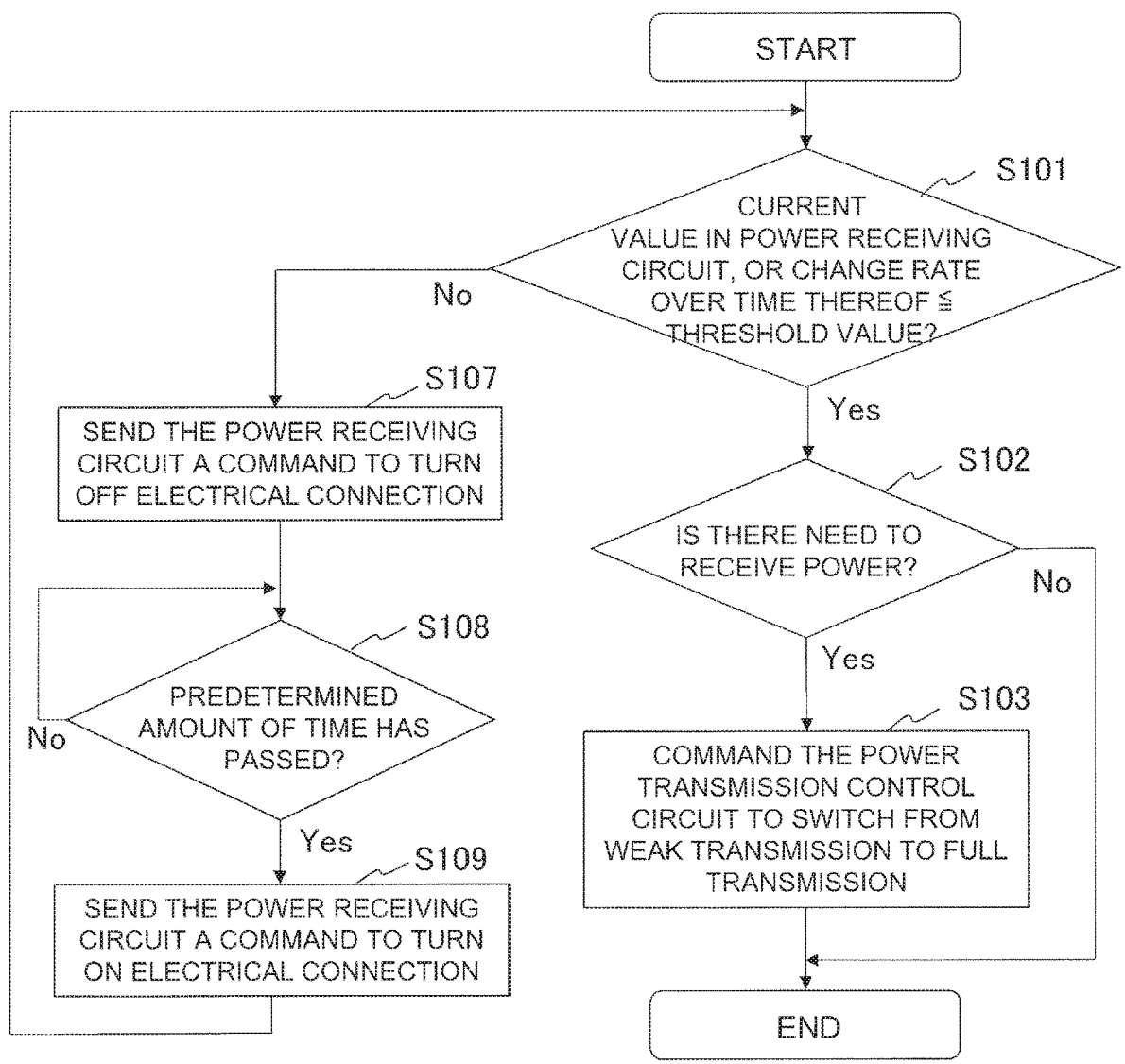

FIG. 9 is a flowchart showing an example of power-receiving circuit controlling in the transport robot 10a. Instead of Steps S104, S105 and S106 in the flowchart of FIG. 6, Steps S107, S108 and S109 are executed. If the current value in the power receiving circuit 210 or the change rate over time thereof is higher than the threshold value, the power reception control circuit 250 sends to the power receiving circuit 210 a command to turn OFF electrical connection via the switch control circuit 255 (S107). Thereafter, the power reception control circuit 250 determines whether the predetermined amount of time has elapsed (S108). If the predetermined amount of time has already elapsed, the power reception control circuit 250 sends to the power receiving circuit 210 a command to turn ON electrical connection, via the switch control circuit 255 (S109). Thereafter, the power reception control circuit 250 again determines whether or not the current value in the power receiving circuit 210 or the change rate over time thereof is equal to or less than the threshold value (S101).

Below is a comparison of behavior between the motor drive controlling method and the power-receiving circuit controlling method described above, in the case where another transport robot 10b that is receiving power exists over the transmission electrodes 120.

Under the motor drive controlling method, the transport robot 10a stops near the entry of the transmission electrodes 120 (FIG. 5A). On the other hand, under the power-receiving circuit controlling method, the transport robot 10a travels over the transmission electrodes 120 without receiving power (FIG. 8A). In other words, under power-receiving circuit controlling, travel of the transport robot 10a does not incur loss of time.

Under the motor drive controlling method, the current in the power receiving circuit 210 of the transport robot 10a has a constant value which is sufficiently smaller than $I_{full}$ (FIG. 5B or FIG. 5C). On the other hand, under the power-receiving circuit controlling, the current in the power receiving circuit 210 of the transport robot 10a becomes zero (FIG. 8B or FIG. 8C). In other words, under the power-receiving circuit controlling method, the transport robot 10a never affects another transport robot 10b over the transmission electrodes 120 that is receiving power.

Under the motor drive controlling method, after the motor is started (S106 in FIG. 6), it is not necessary to again determine whether another transport robot 10b that is receiving power exists over the transmission electrodes 120 or not (S102 in FIG. 6). On the other hand, under the power-receiving circuit controlling method, after electrical connection in the power receiving circuit 210 is turned ON (S109 in FIG. 9), it is determined again as to whether another transport robot 10b that is receiving power exists over the transmission electrodes 120 (S101 in FIG. 9).

In a variant, the motor drive controlling method and the power-receiving circuit controlling method described above may be used in combination.

Figure 10:
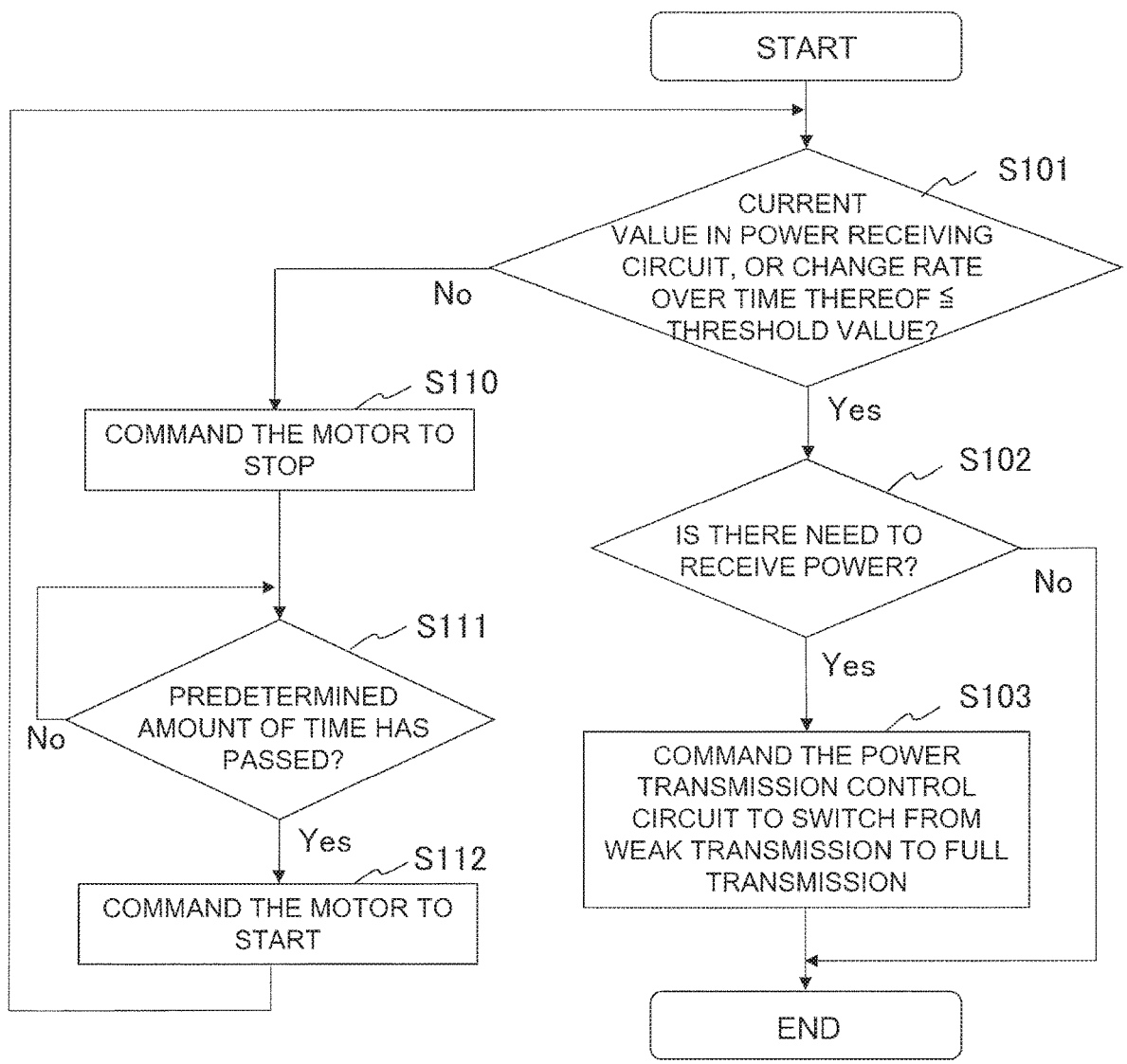

FIG. 10 is a flowchart showing another example of the motor drive controlling method in the transport robot 10a. Instead of Steps S107 to S109 in the flowchart of FIG. 9, Steps S110 to S112 are executed. If the current value in the power receiving circuit 210 or the change rate over time thereof exceeds a threshold value, the power reception control circuit 250 sends a command to the electric motor 330 to stop (S110). Thereafter, the power reception control circuit 250 determines whether a predetermined amount of time has elapsed or not (S111). If the predetermined amount of time has elapsed, the power reception control circuit 250 sends to the electric motor 330 a command to start, via the motor control circuit 340 (S112). Thereafter, the power reception control circuit 250 again determines whether or not the current value in the power receiving circuit 210 or the change rate over time thereof is equal to or less than the threshold value (S101). As the predetermined amount of time, a period of time which is obtained by dividing the length of the transmission electrodes 120 by the velocity of travel of the transport robot 10b may be used. In this case, after the motor in the transport robot 10a is started (S112), there will be no other transport robot 10b over the transmission electrodes 120 that is receiving power. The power reception control circuit 250 may determine whether there is need to receive power or not next (S102).

Figure 11:
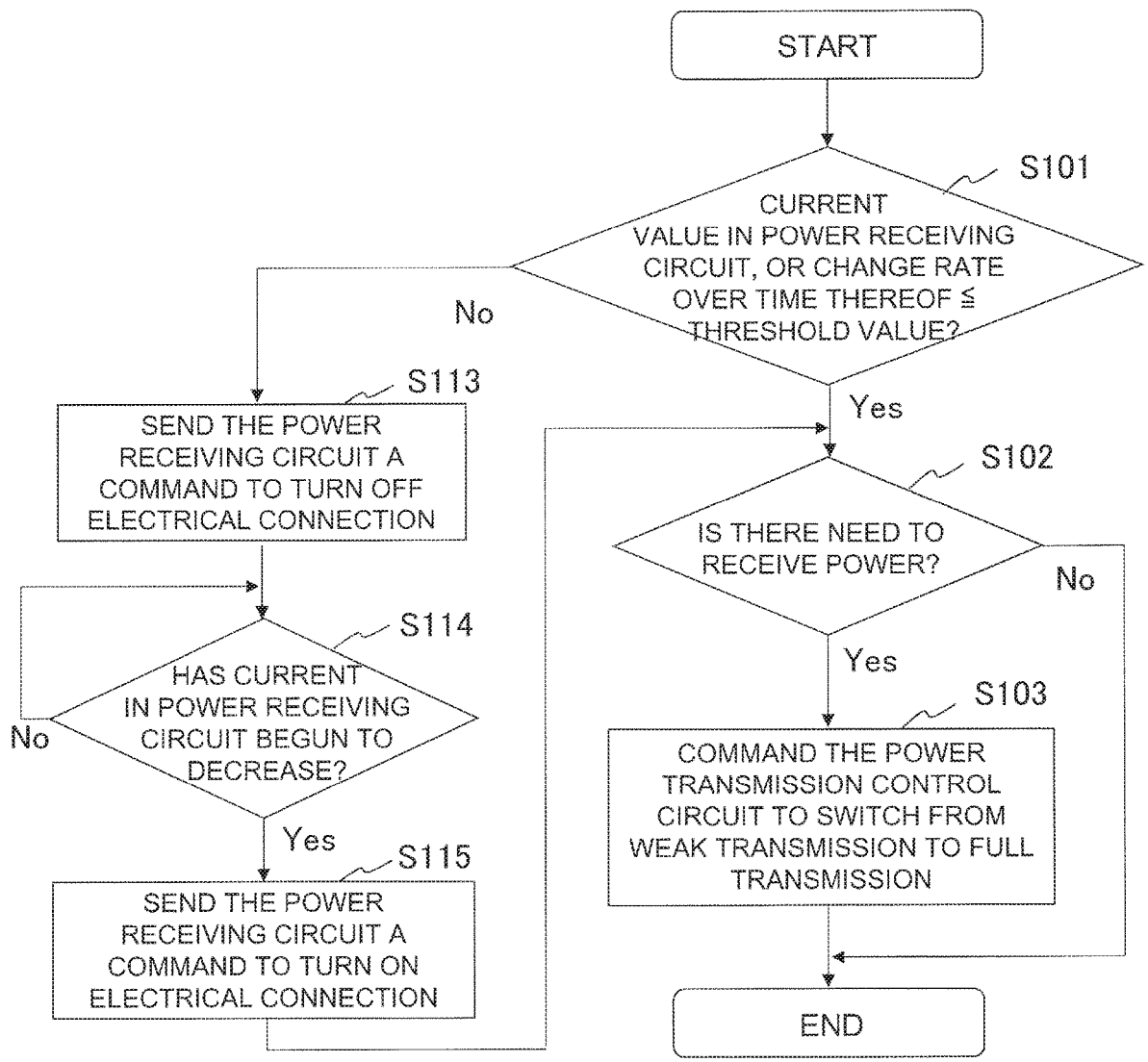

FIG. 11 is a flowchart showing another example of the power-receiving circuit controlling method in the transport robot 10a. Instead of Steps S104 to S106 in FIG. 6, Steps S113 to S115 are executed. If the current value in the power receiving circuit 210 or the change rate over time thereof exceeds a threshold value, the power reception control circuit 250 sends to the power receiving circuit 210 a command to increase impedance (S113). At this time, the current in the power receiving circuit 210 is sufficiently small than $I_{full}$. However, let it be assumed that the current in the power receiving circuit 210 never reaches zero, unlike in the aforementioned power-receiving circuit controlling method. Thereafter, the power reception control circuit 250 determines whether the current in the power receiving circuit 210 has begun to decrease or not (S114). If the current in the power receiving circuit 210 has begun to decrease, the power reception control circuit 250 sends to the power receiving circuit 210 a command to decrease impedance, via the switch control circuit 255 (S115). Thereafter, the power reception control circuit 250 determines whether there is need to receive power or not (S102). Adjustment of the impedance of the power receiving circuit 210 to be higher or lower may be achieved by, for example, changing the value of at least one of the resistance, inductance, and capacitance of the power receiving circuit 210.

Next, effects of the present embodiment will be described in contrast to the technique of Patent Document 1. In Patent Document 1, a voltage monitoring section in the power transmitter monitors voltage. When the voltage exceeds a predetermined threshold value, a power transmission stop section in the power transmitter stops power transmission to the power receiver. On the other hand, in the present embodiment, the power reception control circuit 250 of the transport robot 10a determines the presence or absence of another transport robot 10b over the transmission electrodes 120. If another transport robots 10b exists over the transmission electrodes 120, the transport robot 10a suppress power reception from the transmission electrodes 120. That is, in the present embodiment, power transmission can be controlled on the reception side. Such control of power transmission on the reception side is applicable not only to a system including two vehicles, but also to a system including three or more vehicles.

In the aforementioned embodiment, based on the prerequisite that the transport robot 10a is traveling over the transmission electrodes 120, the power reception control circuit 250 of the transport robot 10a requests the power transmission control circuit 150 to begin full transmission. However, even while the transport robot 10a is not traveling over the transmission electrodes 120, due to noise influences, or due to the transport robot 10a approaching the transmission electrodes 120, a weak current which is much smaller than $I_{weak}$ may flow in the power receiving circuit 210. In this case, at the lapse of a predetermined amount of time, the power reception control circuit 250 of the transport robot 10a may erroneously request the power transmission control circuit 150 to begin power transmission.

In order to prevent such malfunctioning, in addition to the threshold value (first threshold value) that is used for determining the presence or absence of a transport robot 10b over the transmission electrodes 120 that is receiving power, a threshold value (second threshold value) to be satisfied in making a request for power transmission may be introduced. The second threshold value may be set to a smaller value than the first threshold value. For example, after the lapse of a predetermined amount of time, the power reception control circuit 250 of the transport robot 10a may request the power transmission control circuit 150 to begin power transmission only if the current value or the change rate over time thereof has exceeded the second threshold value, while not exceeding the first threshold value. On the other hand, if the current value or the change rate over time thereof does not exceed the second threshold value even after the lapse of the predetermined amount of time during which the current value or the change rate over time thereof has remained below the first threshold value, then the power reception control circuit 250 of the transport robot 10a can determine that the transport robot 10a itself is not traveling over the transmission electrodes 120. In that case, the power reception control circuit 250 of the transport robot 10a may not request the power transmission control circuit 150 to begin power transmission.

When the current value is relied upon, the second threshold value may be $I_{weak}$, or a value which is slightly smaller than that, for example. When the change rate over time of current is relied upon, the second threshold value may be a change rate over time of the amount of increase in the current $C_0$ from zero, or a value which is slightly smaller than that, for example.

In the above embodiment, the power reception control circuit 250 requests the power transmitter 100 for full transmission, through a determination based on change in the current or power flowing in the power receiving circuit 210 of the transport robot 10a. Instead of this operation, while the power transmitter 100 is conducting weak transmission, the power transmission control circuit 150 may determine arrival of the transport robot 10a over the transmission electrodes 120 based on change in the current or power flowing in the power transmitting circuit 110. The power transmitter 100 may request the transport robot 10a to decide whether or not to conduct full transmission. When this request is received, upon determining that full transmission is needed, the power reception control circuit 250 of the transport robot 10a may request the power transmitter 100 for full transmission.

Next, the construction concerning power transmission by the wireless power transmission system according to the present embodiment will be described in more detail. Note that the system construction as described below is only exemplary, and may be modified as appropriate, depending on the required function and performance.

Figure 12:
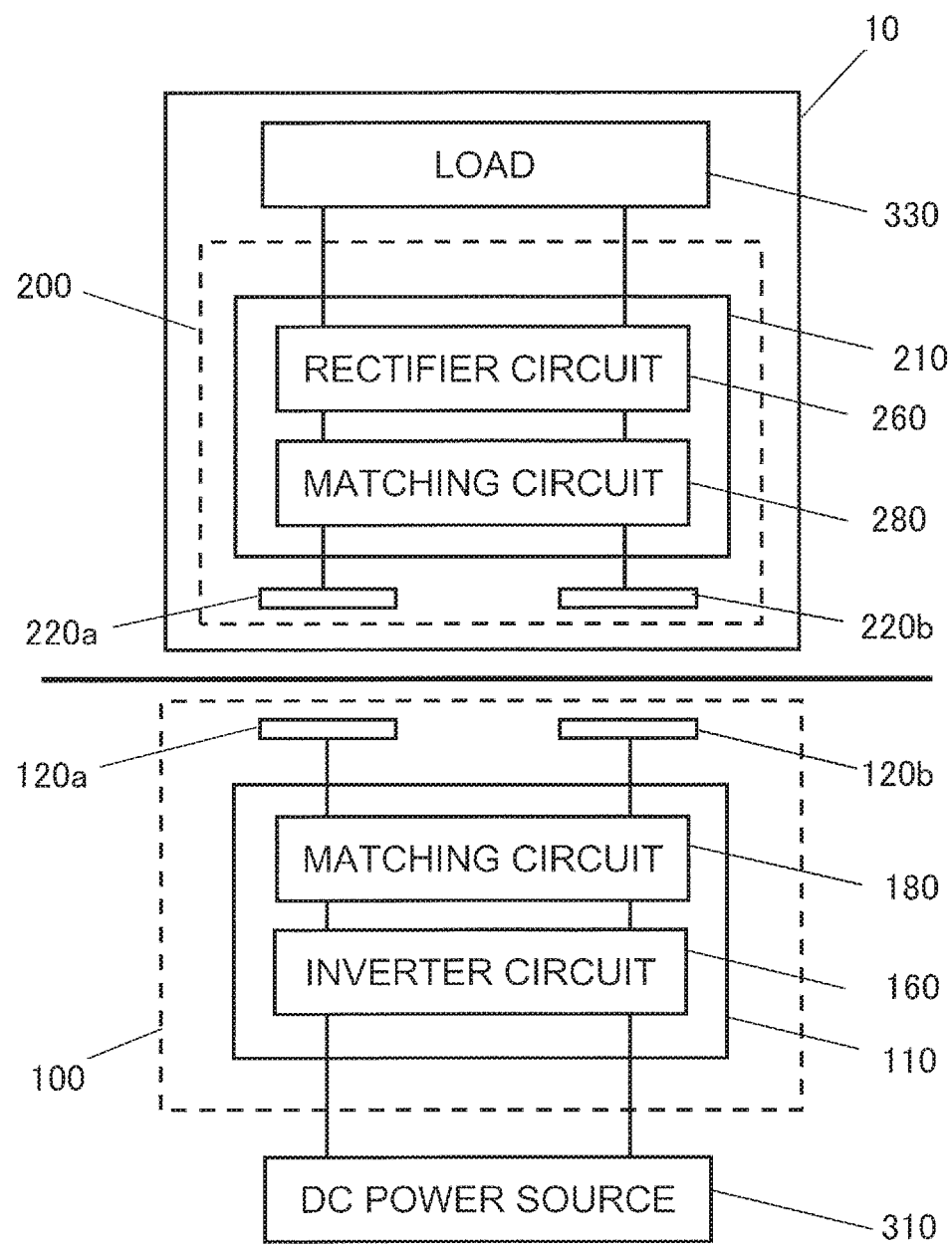
FIG. 12 is block diagram generally showing a construction involved in the power transmission in a wireless power transmission system according to the present embodiment.

FIG. 12 is block diagram generally showing a construction involved in the power transmission in the wireless power transmission system according to the present embodiment. In FIG. 12, the power reception control circuit 250 is omitted from illustration. The power transmitter 100 includes an inverter circuit 160 which converts DC power that is supplied from an external DC power source 310 into AC power, two transmission electrodes 120a and 120b which transmit the AC power, and a matching circuit 180 which is connected between the inverter circuit 160 and the transmission electrodes 120a and 120b. The "DC power source 310" also encompasses a power source that results from converting externally-supplied AC power into DC power with a converter circuit. In the present embodiment, the inverter circuit 160 are electrically connected to the first and second transmission electrodes 120a and 120b via the matching circuit 180, and outputs AC power to the first and second transmission electrodes 120a and 120b. The transport robot 10 includes a power receiver 200 and a load 330.

The power receiver 200 includes two reception electrodes 220a and 220b which establish capacitive coupling with the two transmission electrodes 120a and 120b to receive electric power, a matching circuit 280 connected to the two reception electrodes 220a and 220b, and a rectifier circuit 260 which is connected to the matching circuit 280 and converts the received AC power into DC power and outputs it. When opposed to the first transmission electrode 120a, the first reception electrode 220a establish capacitive coupling with the first transmission electrode 120a. When opposed to the second transmission electrode 120b, the second reception electrode 220b establish capacitive coupling with the second transmission electrodes. Via these two sites of capacitive coupling, AC power is contactlessly transmitted from the power transmitter 100 to the power receiver 200.

Although not particularly limited, the respective sizes of the housing of the transport robot 10 according to the present embodiment, the transmission electrodes 120a and 120b, and the reception electrodes 220a and 220b may be set to the following sizes, for example. The length (i.e., the size along the Y direction) of each of the transmission electrodes 120a and 120b may be set in a range from 50 cm to 20 m, for example. The width (i.e., the size along the X direction) of each of the transmission electrodes 120a and 120b may be set in a range from 5 cm to 2 m, for example. The sizes along the traveling direction and the lateral direction of the housing of the transport robot 10 may be set in a range from 20 cm to 5 m, for example. The length (i.e., the size along the traveling direction) of each reception electrode 220a may be set in a range from 5 cm to 2 m, for example. The width (i.e., the size along the lateral direction) of each reception electrode 220a may be set in a range from 2 cm to 2 m, for example. However, these numerical ranges are not limiting.

The load 330 may include an electric motor for driving purposes and a capacitor for electrical storage purposes, for example, and may be driven or charged by DC power which is output from the power receiving circuit 210.

The electric motor may be any type of motor, such as a DC motor, a permanent magnet synchronous motor, an induction motor, a stepping motor, or a reluctance motor. The motor rotates the wheels of the transport robot 10 via shafts, gears, and the like, thus causing the transport robot 10 to move. Depending on the kind of motor used, the power receiving circuit 210 may include various circuits, e.g., a rectifier circuit(s), an inverter circuit(s), and/or an inverter control circuit(s).

The capacitor may be a high-capacitance and low-resistance capacitor, such as an electric double layer capacitor or a lithium-ion capacitor. Using such a capacitor as a means of electrical storage will allow for more rapid charging than when a battery (secondary battery) is used. Instead of a capacitor, a secondary battery (e.g., a lithium-ion battery) may be used. In that case, although more time will be required for charging, a greater amount of energy can be stored. The motor is driven with the electric power that is stored in the capacitor or secondary battery, whereby the transport robot 10 moves.

As the transport robot 10 moves, the amount of stored electricity (charge amount) in the capacitor or secondary battery will decrease. Therefore, recharging will be required in order to continue the movement. Therefore, when the charge amount falls below a predetermined threshold value during movement, the transport robot 10 will perform charging from the power transmitter 100.

Figure 13:
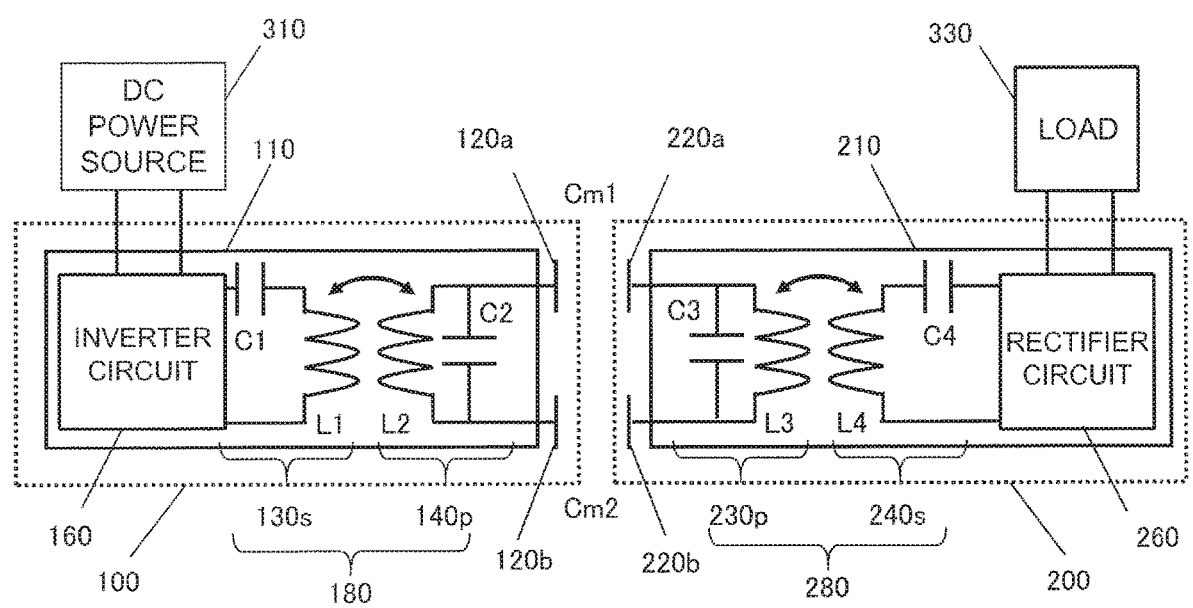
FIG. 13 is a circuit diagram showing a more detailed exemplary construction for the wireless power transmission system.

FIG. 13 is a circuit diagram showing a more detailed exemplary construction for the wireless power transmission system. In the example shown in the figure, the matching circuit 180 of the power transmitter 100 includes a series resonant circuit 130s which is connected to the power transmitting circuit 110, and a parallel resonant circuit 140p which is connected to the transmission electrodes 120a and 120b and establishes inductive coupling with the series resonant circuit 130s. The matching circuit 180 has the function of matching the impedance of the inverter circuit 160 with the impedance of the transmission electrodes 120a and 120b. The series resonant circuit 130s of the power transmitter 100 includes a first coil L1 and a first capacitor C1 being connected in series. The parallel resonant circuit 140p of the power transmitter 100 includes a second coil L2 and a second capacitor C2 being connected in parallel. The first coil L1 and the second coil L2 constitute a transformer whose coupling is based on a predetermined coupling coefficient. The turns ratio between the first coil L1 and the second coil L2 is set to a value that realizes a desired transformation ratio (a step-up ratio or a step-down ratio).

The matching circuit 280 of the power receiver 200 includes a parallel resonant circuit 230p which is connected to the reception electrodes 220a and 220b and a series resonant circuit 240s which is connected to the rectifier circuit 260 and establishes inductive coupling with the parallel resonant circuit 230p. The matching circuit 280 has the function of matching the impedance of the reception electrodes 220a and 220b with the impedance of the power receiving circuit 210. The parallel resonant circuit 230p includes a third coil L3 and a third capacitor C3 being connected in parallel. The series resonant circuit 240s of the power receiver 200 includes a fourth coil L4 and a fourth capacitor C4 being connected in series. The third coil L3 and the fourth coil L4 constitute a transformer whose coupling is based on a predetermined coupling coefficient. The turns ratio between the third coil L3 and the fourth coil L4 is set to a value that realizes a desired transformation ratio.

Note that the construction of the matching circuits 180 and 280 is not limited to what is shown in FIG. 13. For example, a parallel resonant circuit may be provided instead of each of the series resonant circuits 130s and 240s. Moreover, a series resonant circuit may be provided instead of each of the parallel resonant circuits 140p and 230p. Furthermore, one or both of the matching circuits 180 and 280 may be omitted. In the case of omitting the matching circuit 180, the inverter circuit 160 and the transmission electrodes 120a and 120b are directly connected. In the case of omitting the matching circuit 280, the rectifier circuit 260 and the reception electrodes 220a and 220b are directly connected. In the present specification, a construction where the matching circuit 180 is provided also qualifies as a construction in which the inverter circuit 160 and the transmission electrodes 120a and 120b are electrically connected. Similarly, a construction where the matching circuit 280 is provided also qualifies as a construction in which the rectifier circuit 260 and the reception electrodes 220a and 220b are electrically connected.

Figure 14A:
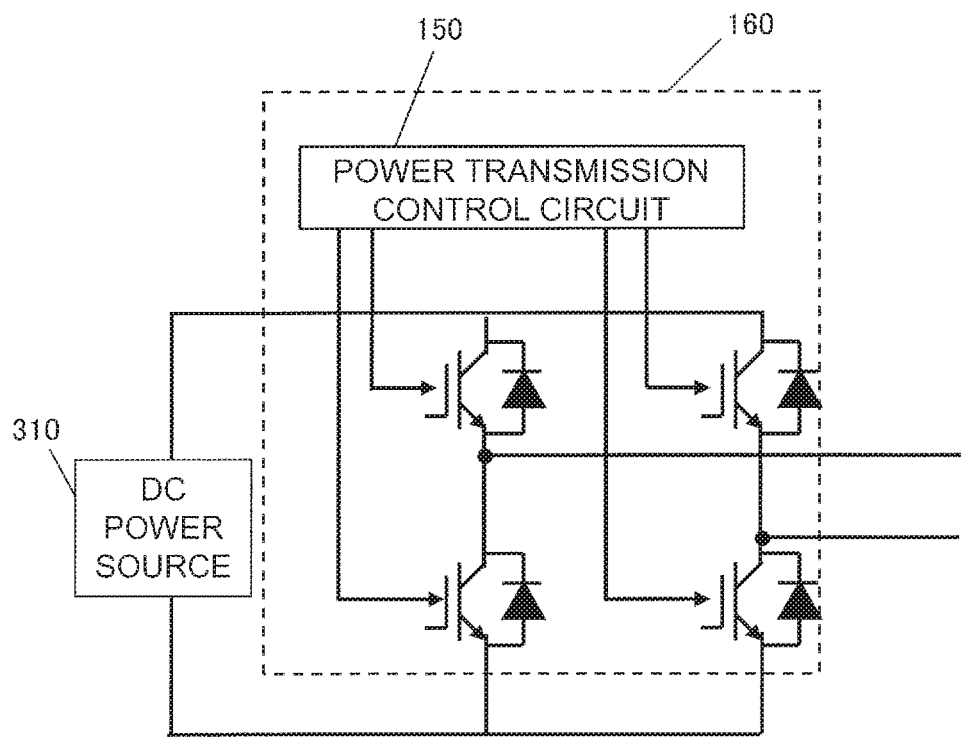
FIG. 14A is a diagram schematically showing an exemplary construction for an inverter circuit 160.

FIG. 14A is a diagram schematically showing an exemplary construction for the inverter circuit 160. In this example, the inverter circuit 160 includes a full-bridge inverter circuit that contain four switching elements (e.g., transistors such as IGBTs or MOSFETs) and the power transmission control circuit 150. The power transmission control circuit 150 includes a gate driver which outputs a control signal to control the ON (conducting) or OFF (non-conducting) state of each switching element and a processor which causes the gate driver to output a control signal, e.g., a microcontroller. Instead of the full-bridge inverter circuit that is shown in the figure, a half-bridge inverter circuit, or any other oscillation circuit, e.g., that of class E, may also be used. The inverter circuit 160 may include modulation/demodulation circuitry for communication purposes and various sensors for measuring voltage, current, etc. In the case where modulation/demodulation circuitry for communication purposes is included, data may be superposed onto the AC power so as to be sent to the power receiver 200.

Note that the present disclosure also embraces implementations where a weak AC signal (e.g., a pulse signal) is sent to the power receiver 200 for the purpose of data transmission, rather than power transmission. In such an implementation, too, it can be said that weak electric power is being transmitted; therefore, transmission of a weak AC signal (e.g., a pulse signal) is also encompassed under the notion of "power transmission". Moreover, such a weak AC signal is also encompassed under the notion of "AC power".

Figure 14B:
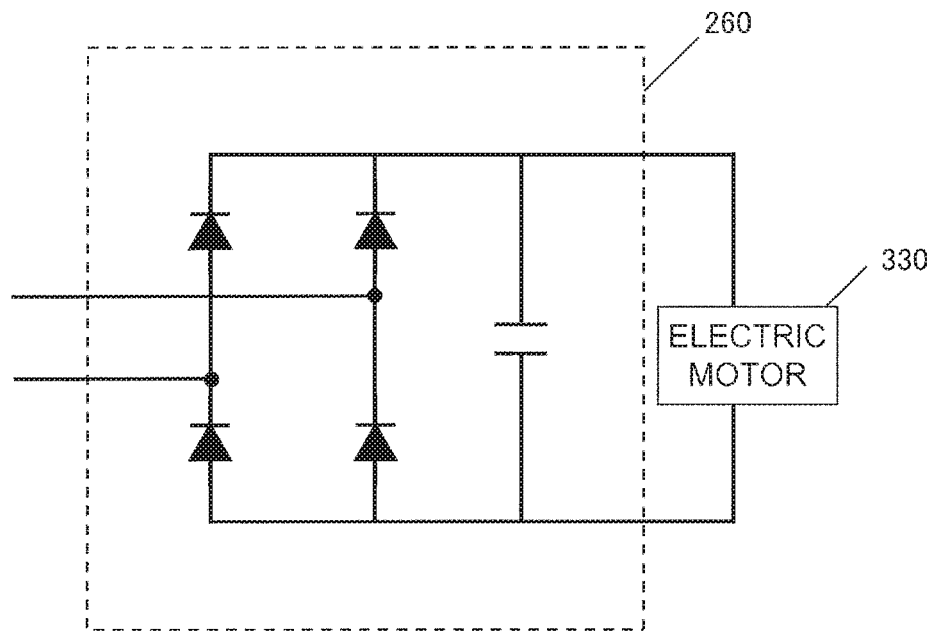
FIG. 14B is a diagram schematically showing an exemplary construction for a rectifier circuit 260.

FIG. 14B is a diagram schematically showing an exemplary construction for the rectifier circuit 260. In this example, the power receiving circuit 210 is a full-wave rectifier circuit including a diode bridge and a smoothing capacitor. The rectifier circuit 260 may have any other rectifier construction. Other than the rectifier circuit 260, various circuits may also be included, such as constant voltage/constant current control circuitry, and/or modulation/demodulation circuitry for communication purposes. The rectifier circuit 260 converts the received AC energy into DC energy which is available for use by the load 330. Various sensors for measuring the voltage and current, etc., being output from the series resonant circuit 240s may also be included in the rectifier circuit 260.

Each coil in the resonant circuits 130s, 140p, 230p and 240s may be, for example, a planar coil or a laminated coil that is formed on a circuit board, or a wound coil of a copper wire, a litz wire, a twisted wire, or the like. Each capacitor in the resonant circuits 130s, 140p, 230p and 240s may be any type of capacitor having a chip shape or a lead shape, for example. It may also be possible to allow the capacitance between two wiring lines, with air interposed therebetween, to function as a capacitor. The self-resonance property of each coil may also be utilized to replace any such capacitor.

The DC power source 310 may be any kind of power source, e.g., a mains supply, a primary battery, a secondary battery, a photovoltaic cell, a fuel cell, a USB (Universal Serial Bus) power source, a high-capacitance capacitor (e.g., an electric double layer capacitor), a voltage converter that is connected to a mains supply, or the like.

The resonant frequency f0 of the resonant circuits 130s, 140p, 230p and 240s is typically set equal to the transmission frequency f during power transmission. The resonant frequency f0 of each of the resonant circuits 130s, 140p, 230p and 240s may not be exactly equal to the transmission frequency f. Each resonant frequency f0 may be set to a value in a range from about 50% to about 150% of the transmission frequency f, for example. The power transmission frequency f may be set to e.g. 50 Hz to 300 GHz, more preferably 20 kHz to 10 GHz, still more preferably 20 kHz to 20 MHz, and further more preferably 20 kHz to 7 MHz.

In the present embodiment, an air gap exists between the transmission electrodes 120a and 120b and the reception electrodes 220a and 220b, with a relatively long distance therebetween (e.g., about 10 mm). Therefore, the capacitances Cm1 and Cm2 between these pairs of electrodes are very small, while the impedances of the transmission electrodes 120a and 120b and the reception electrodes 220a and 220b are very high (e.g., on the order of several kΩ). On the other hand, the impedances of the power transmitting circuit 110 and the power receiving circuit 210 are as low as several Ω, for example. In the present embodiment, the parallel resonant circuits 140p and 230p are disposed closer to the transmission electrodes 120a, 120b and the reception electrodes 220a, 220b, respectively, whereas the series resonant circuits 130s and 240s are disposed closer to the power transmitting circuit 110 and the power receiving circuit 210, respectively. With such a construction, impedance matching can be easily attained. A series resonant circuit has zero (0) impedance during resonance, and therefore allows for matching with low impedance. On the other hand, a parallel resonant circuit has infinite impedance during resonance, and therefore allows for matching with high impedance. Thus, as in the construction shown in FIG. 13, impedance matching can be easily achieved by disposing a series resonant circuit on the power source side, which is low in impedance, and a parallel resonant circuit on the electrode side, which is high in impedance. Similarly, impedance matching in the power receiver 200 can be suitably achieved by disposing a parallel resonant circuit on the electrode side and a series resonant circuit on the load side.

In a construction where the distance between the transmission electrodes 120a and 120b and the reception electrodes 220a and 220b is made shorter, or a dielectric is interposed therebetween, the impedances of the electrodes will be lowered, so that the aforementioned asymmetric resonant circuit construction is unnecessary. When there is no issue of impedance matching, the matching circuits 180 and 280 may themselves be omitted.

Embodiment 2

Next, an illustrative second embodiment of the present disclosure will be described.

In the present embodiment, the determination as to whether a vehicle is to receive power or not is made by an external apparatus, which is distinct from the vehicle. The external apparatus notifies the vehicle of the result of determination. Upon receiving this notice, the vehicle alters its own impedance.

Figure 15:
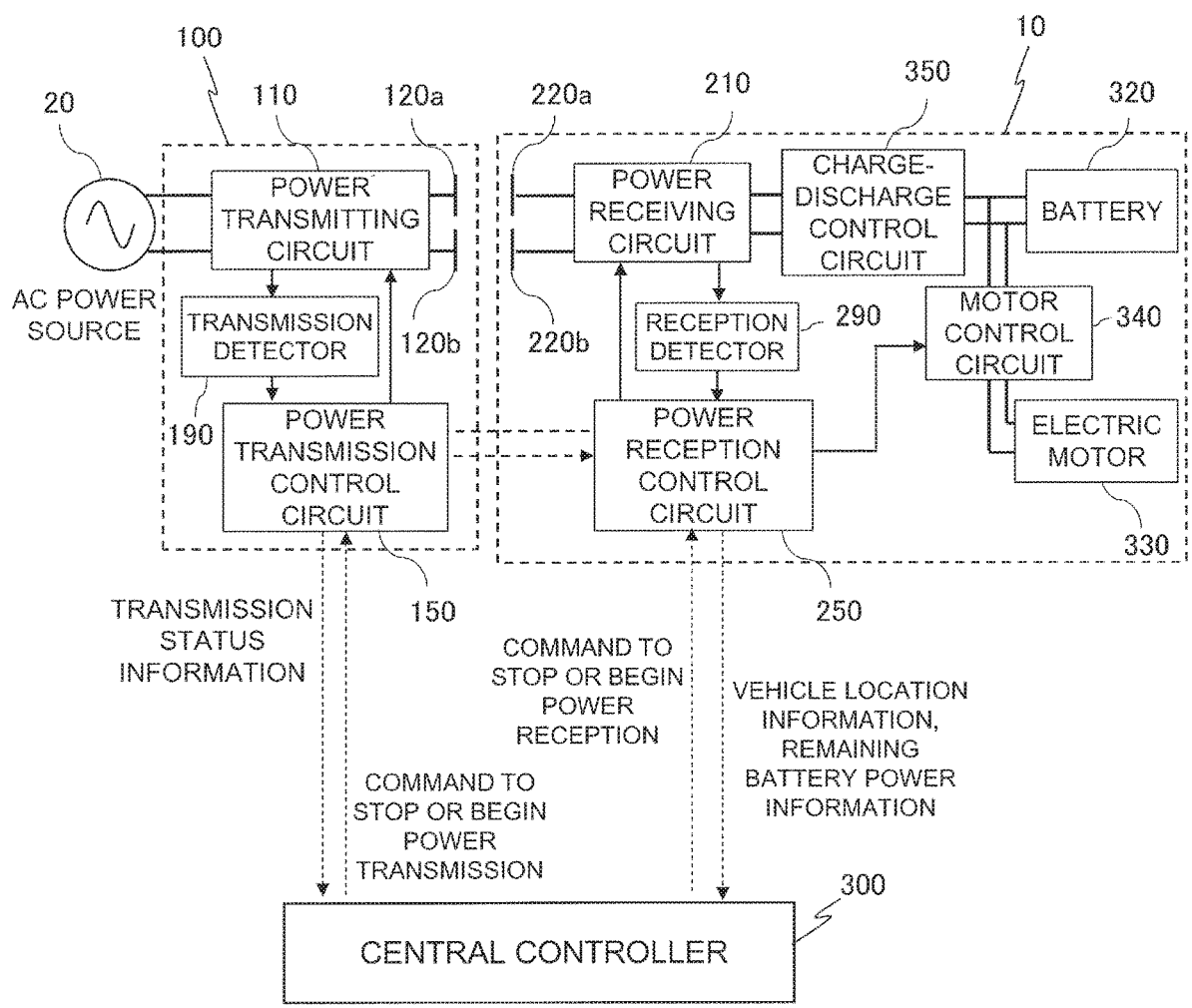
FIG. 15 is a block diagram showing the construction of a wireless power transmission system according to Embodiment 2.

FIG. 15 is a block diagram showing the construction of a wireless power transmission system according to the present embodiment. This wireless power transmission system includes at least one power transmitter 100, at least one vehicle 10, and a central controller 300 which manages traveling operations of the vehicle 10. The central controller 300 controls the power transmitter 100 and the at least one vehicle 10. The central controller 300 is connected, in a wireless or wired manner, to the power transmission control circuit 150 of the power transmitter 100 and the power reception control circuit 250 of the vehicle 10.

The central controller 300 may be implemented as a computer having a control circuit such as a CPU and a storage device such as a memory, for example. As the control circuit executes a computer program which is stored in the storage device, the operation described may be achieved.

To the power transmission control circuit 150, the central controller 300 sends a command to stop or begin power transmission. During power transmission, the power transmission control circuit 150 sends information concerning the status of electric power transmission, e.g., a value of at least one of power, voltage and current in the power transmitting circuit 110, to the central controller 300. Transmission of this information from the power transmitter 100 to the central controller 300 may be performed every predetermined period of time, for example.

Moreover, the central controller 300 sends to the power reception control circuit 250 a command to begin or stop power reception. The power reception control circuit 250 sends information representing the location of the vehicle 10 and information representing the remaining power in the battery 320 to the central controller 300. Transmission of this information from the power receiver 10 to the central controller 300 may be performed every predetermined period of time, for example.

The power transmitter 100 and the vehicle 10 shown in FIG. 15 are similar in construction to those shown in FIG. 3. Alternatively, the vehicle 10 may have a construction as shown in FIG. 7A.

Based on at least one of the information representing the status of electric power transmission, the information representing the location of the vehicle 320, and the information representing the remaining power in the battery 320, the central controller 300 determines the timing to begin or stop power reception in the vehicle 10. When the vehicle 10 is about to arrive over the transmission electrodes 120, the central controller 300 determines whether the vehicle 10 is to receive power or not, on basis of the above information. Based on the result of determination, the central controller 300 sends a command to begin power reception or a command to stop power reception to the power reception control circuit 250. In accordance with the command to begin power reception or the command to stop power reception, the power reception control circuit 250 of the vehicle 10 adjusts its own impedance.

Figure 16:
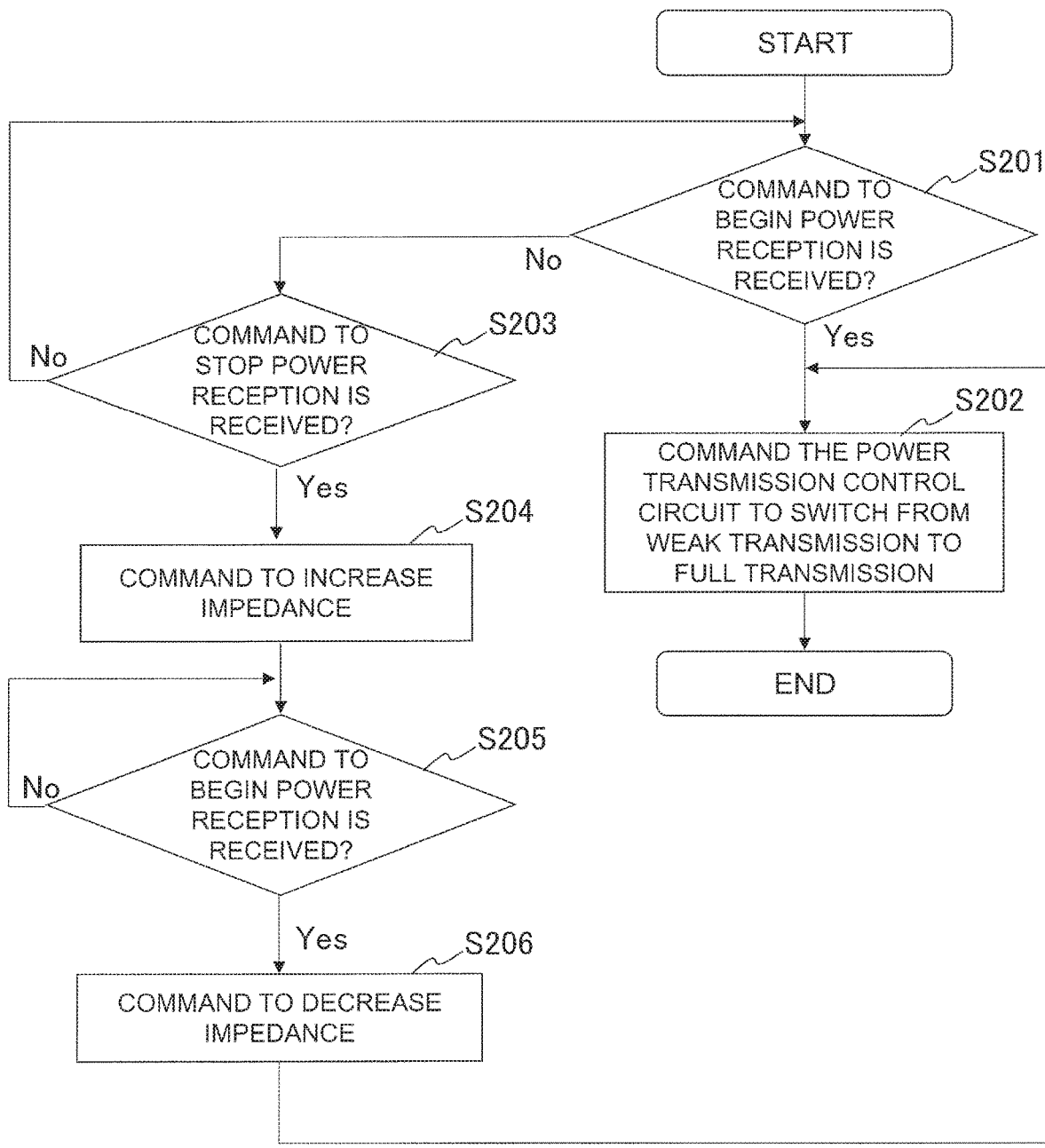
FIG. 16 is a flowchart showing an operation of a vehicle 10 according to Embodiment 2.

FIG. 16 is a flowchart showing an operation of the vehicle 10 according to the present embodiment. The power reception control circuit 250 of the vehicle 10 executes the following operation.

Step S201: The power reception control circuit 250 determines whether a command to begin power reception has been received or not. If Yes, control proceeds to Step S202. If No, control proceeds to Step S203.

Step S202: Upon receiving a command to begin power reception, the power reception control circuit 250 sends to the power transmission control circuit 150 a command to switch from weak transmission to full transmission.

step S203: The power reception control circuit 250 determines whether a command to stop power reception has been received or not. If Yes, control proceeds to Step S204. If No, control returns to Step S201.

Step S204: Upon receiving a command to stop power reception, the power reception control circuit 250 sends to the motor control circuit 340 a command to increase impedance. Upon receiving this command, the motor control circuit 340 stops the motor 330.

Step S205: Next, the power reception control circuit 250 determines whether a command to begin power reception has been received again. If Yes, control proceeds to Step S206. If No, Step S205 is performed again.

Step S206: Upon receiving a command to begin power reception again, the power reception control circuit 250 sends to the motor control circuit 340 a command to decrease impedance. Upon receiving this command, the motor control circuit 340 drives the motor 330 again.

In the example of FIG. 16, the motor control circuit 340 increases the impedance of the vehicle 10 as viewed from the power transmitter 100 by stopping the motor 330. Alternatively, the power reception control circuit 250 may introduce an increased impedance through control of a switch(es), resistance, capacitance, or inductance in the power receiving circuit 210. In the present embodiment, the power reception control circuit 250 and the motor control circuit 340 together function as the "first control circuit".

The central controller 300 may make a determination to begin or stop power reception based on the following prerequisites, for example.

Prerequisites:
(1) Location information of all transmission electrodes 120 within the system is retained.
(2) For each transmission electrode 120, information as to whether the power transmitter is transmitting power is constantly being acquired.
(3) For each and every vehicle 10 within the system, location information and the remaining charge information on the battery 320 are constantly being acquired.
(4) As a given vehicle 10 approaches the transmission electrodes 120, if another vehicle 10 distinct from that vehicle 10 happens to exist over the transmission electrodes 120, a determination to "begin or stop power reception" is made for these vehicles 10, and a command is sent thereto.

For each vehicle 10, the central controller 300 makes a determination to begin or stop power reception based on any one of the following Criteria 1 to 3, for example.

Criterion 1: First Come, First Served

The vehicle that was the first to exist over the transmission electrodes is given priority, and a command to "stop power reception" is sent to a later-approaching vehicle.

Criterion 2: Priority Based on Remaining Charge

Whichever vehicle has less remaining charge is given priority, and a command to "stop power reception" is sent to the vehicle that has comparatively more remaining charge.

Criterion 3: Priority to the Latter

The later-approaching vehicle is given priority, and a command to "stop power reception" is sent to the vehicle that was the first to exist over the transmission electrodes.

Figure 17:
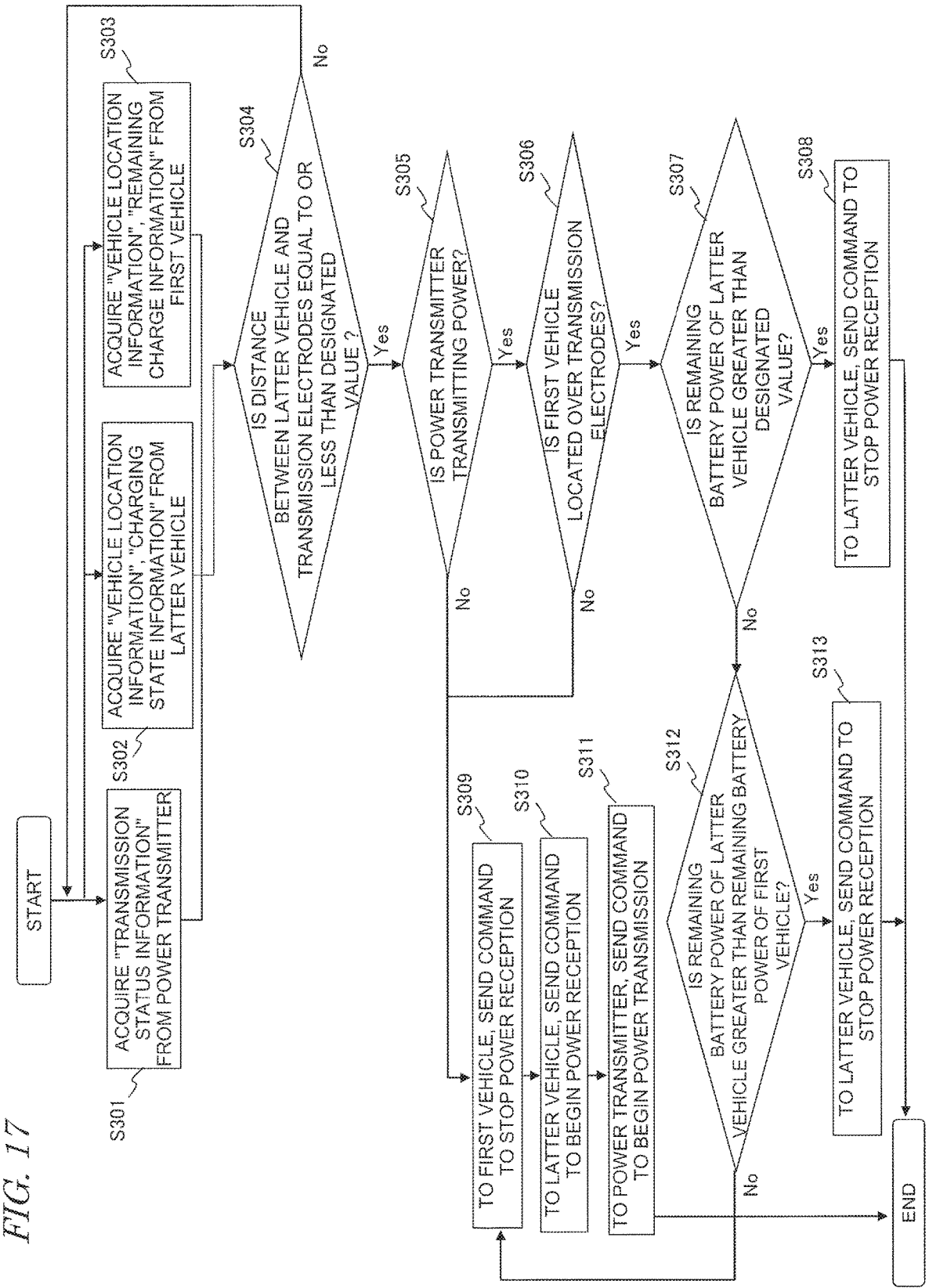
FIG. 17 is a flowchart showing an exemplary operation of a central controller 300.

Hereinafter, with reference to FIG. 17, an exemplary operation of the central controller 300 will be described. FIG. 17 is a flowchart showing an exemplary operation of the central controller 300. It is assumed herein that, as shown in FIG. 5A, two vehicles 10*a* and 10*b* are vying to receive power from the pair of transmission electrodes 120. The vehicle 10*b* that was the first to exist over the transmission electrodes will be referred to as "the first vehicle 10*b*", whereas the vehicle that later approached the transmission electrodes will be referred to as "the latter vehicle 10*a*". In this example, the central controller 300 performs the following operation.

S301: Transmission status information is acquired from the power transmitter 100.

S302: Mobile unit location information and charging state information are acquired from the latter vehicle 10*a*.

S303: Mobile unit location information and charging state information are acquired from the first vehicle 10*b*.

Note that Steps S301 through S303 may be executed in any arbitrary order.

S304: It is determined whether or not the distance between the latter vehicle 10*a* and the transmission electrodes 120 has become equal to or less than a designated value. If No, control returns to Steps S301 through S303. If Yes, control proceeds to Step S305. Note that the distance between the vehicle 10*a* and the transmission electrodes 120 may be calculated from the location information of each transmission electrode and each vehicle.

S305: It is determined whether the power transmitter 100 is transmitting power or not. If Yes, control proceeds to Step S306. If No, control proceeds to Step S309.

S306: It is determined whether the first vehicle 10*b* is located the transmission electrodes or not. If Yes, control proceeds to Step S307. If No, control proceeds to Step S309.

S307: It is determined whether or not the remaining battery power of the latter vehicle 10*a* is greater than a designated value. If Yes, control proceeds to Step S308. If No, control proceeds to Step S312.

S308: A command to stop power reception is sent to the latter vehicle 10*a*.

S309: A command to stop power reception is sent to the first vehicle 10*b*.

S310: A command to begin power reception is sent to the latter vehicle 10*a*.

S311: A command to begin power transmission is sent to the power transmitter 100.

S312: It is determined whether or not the remaining battery power of the latter vehicle 10*a* is greater than the remaining battery power of the first vehicle 10*b*. If Yes, control proceeds to Step S313. If No, control proceeds to Step S309.

S313: A command to stop power reception is sent to the latter vehicle 10*a*.

Through the above operation, it becomes possible to supply electric power as appropriate, in accordance with the remaining battery powers of the first vehicle 10*b* and the latter vehicle 10*a*.

Although the pair of transmission electrodes 120 are installed on the ground in the above embodiments, the pair of transmission electrodes 120 may instead be installed on a lateral surface, e.g., a wall, or an overhead surface, e.g., a ceiling. Depending on the place and orientation in which the transmission electrodes 120 are installed, the arrangement and orientation of the reception electrodes 220 of the vehicle 10 are to be determined.

Figure 18A:
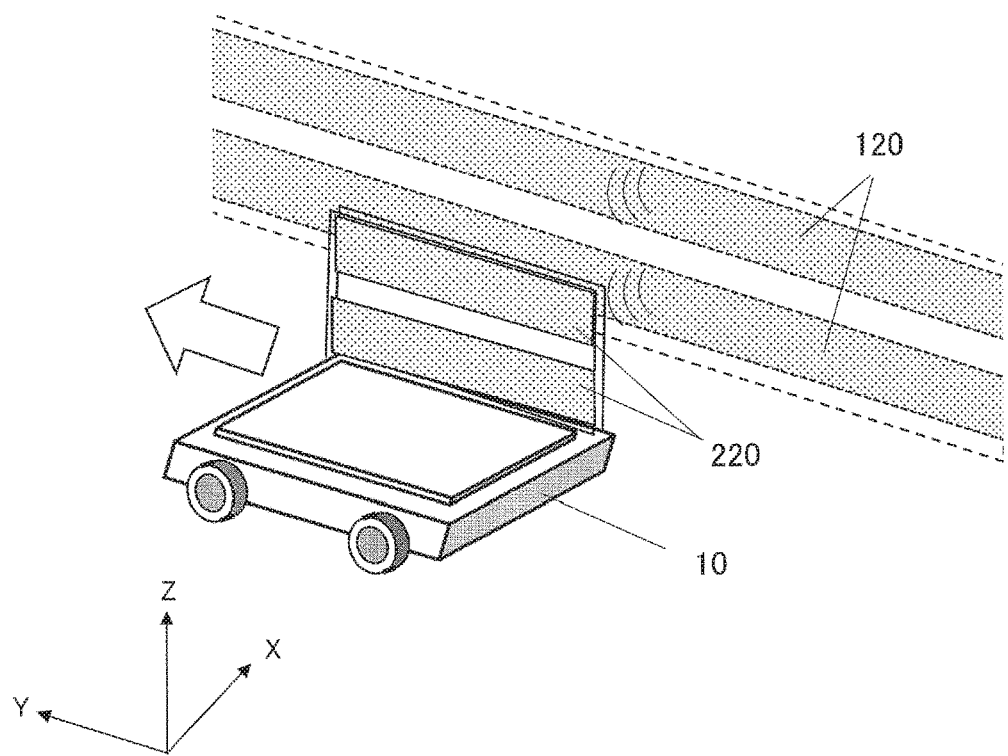
FIG. 18A is a diagram showing an example where transmission electrodes 120 are installed on a lateral surface e.g., a wall.
Figure 18B:
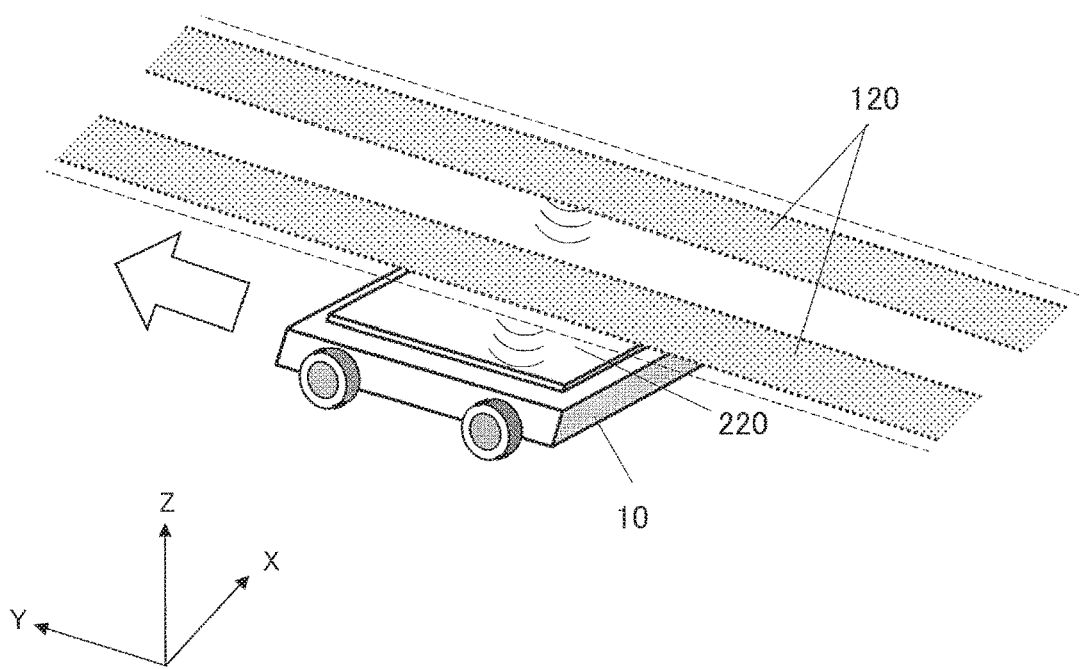
FIG. 18B is a diagram showing an example where transmission electrodes 120 are installed on a ceiling.

FIG. 18A is a diagram showing an example where the transmission electrodes 120 are installed on a lateral surface e.g., a wall. In this example, the reception electrodes 220 are provided on a lateral side of the vehicle 10. FIG. 18B is a diagram showing an example where the transmission electrodes 120 are installed on a ceiling. In this example, the reception electrodes 220 are provided on the top of the vehicle 10. As demonstrated by these examples, there may be a variety of arrangements for the transmission electrodes 110 and the reception electrodes 210.

A wireless power transmission system according to an embodiment of the present disclosure may be used as a system of transportation for articles within a factory, as mentioned above. The transport robot 10 functions as a cart having a bed on which to carry articles, and autonomously move in the factory to transport articles to necessary places. However, without being limited to such purposes, the wireless power transmission system and the vehicle according to the present disclosure are also usable for various other purposes. For example, without being limited to an AGV, the vehicle may be any other industrial machine, a service robot, an electric vehicle, a multicopter (drone), or the like. Without being limited to being used in a factory, the wireless power transmission system may be used in shops, hospitals, households, roads, runways, or other places, for example.

As described above, the present disclosure encompasses vehicles and wireless power transmission systems as recited in the following Items.

Item 1. A vehicle to be driven by electric power which is wirelessly transmitted from a power transmitter having two transmission electrodes, the vehicle comprising:

two reception electrodes to receive AC power from the two transmission electrodes through capacitive coupling respectively with the two transmission electrodes;

a power receiving circuit which is connected to the two reception electrodes to convert AC power received by the two reception electrodes into DC power or another form of AC power, and supply the DC power or other form of AC power to an electric motor which drives the vehicle or to a secondary battery which stores electric power for driving the vehicle; and a first control circuit which, while the vehicle is moving with the two reception electrodes being opposed to the two transmission electrodes, increases an impedance of the vehicle as viewed from the power transmitter in response to an instruction that the electric power from the power transmitter is not to be received.

Item 2. The vehicle of item 1, further comprising a second control circuit which acquires information on at least one of a status of electric power transmission from the power transmitter to the vehicle, location of the vehicle, and remaining power of the secondary battery, determines whether or not electric power from the power transmitter is to be received based on the information, and sends the instruction to the first control circuit when determining that the electric power is not to be received.

Item 3. The vehicle of item 1 or 2, wherein the second control circuit sends the instruction to the first control circuit when a value of at least one of power, voltage and current in the power receiving circuit, or a change rate over time thereof, exceeds a threshold value.

Item 4. The vehicle of item 3, wherein, the value of at least one of power, voltage and current in the power receiving circuit, or the change rate over time thereof, is greater than the threshold value when the power transmitter is transmitting power to another vehicle distinct from the vehicle; and the value of at least one of power, voltage and current in the power receiving circuit, or the change rate over time thereof, is not greater than the threshold value when the power transmitter is not transmitting power to another vehicle distinct from the vehicle.

Item 5. The vehicle of item 3 or 4, wherein, while the two reception electrodes are opposed respectively to the two transmission electrodes, if a predetermined amount of time has elapsed before the value of at least one of power, voltage and current in the power receiving circuit, or the change rate over time thereof, exceeds the threshold value, the first control circuit requests the power transmitter for power transmission.

Item 6. The vehicle of any of items 1 to 5, wherein, when receiving the instruction from a central controller which manages traveling operations of the vehicle, the first control circuit increases the impedance of the vehicle as viewed from the power transmitter.

Item 7. The vehicle of item 6, wherein, the central controller acquires information on at least one of a status of electric power transmission from the power transmitter to the vehicle, location of the vehicle, and remaining power of the secondary battery, determines whether or not the vehicle is to receive the electric power from the power transmitter based on the information, and when determining that the electric power from the power transmitter is not to be received from the vehicle, sends the instruction to the first control circuit.

Item 8. The vehicle of any of items 1 to 7, wherein the first control circuit includes a motor control circuit which controls the electric motor, and the motor control circuit increases the impedance of the vehicle as viewed from the power transmitter by sending the electric motor a command to stop.

Item 9. The vehicle of item 8, wherein, after sending the electric motor the command to stop, at the lapse of a predetermined amount of time, the first control circuit sends the electric motor a command to start again.

Item 10. The vehicle of item 9 or 10, wherein, after sending the electric motor the command to stop, if the value of at least one of power, voltage and current in the power receiving circuit, or the change rate over time thereof, becomes lower than a second threshold value which is equal to or smaller than the threshold value, the first control circuit sends the electric motor a command to start again.

Item 11. The vehicle of any of items 1 to 10, wherein, the power receiving circuit includes a switch to turn ON or OFF electrical connection between the two reception electrodes and the electric motor; and the first control circuit increases the impedance of the vehicle as viewed from the power transmitter by sending the switch a command to turn OFF the electrical connection.

Item 12. The vehicle of item 11, wherein, after sending the command to the switch, at the lapse of a predetermined amount of time, the control circuit sends the switch a command to turn ON the electrical connection.

Item 13. The vehicle of item 11 or 12, wherein,
the power receiving circuit includes
a rectifier circuit, and
a switch circuit which is connected between the two reception electrodes and the rectifier circuit, the switch circuit including the switch.

Item 14. The vehicle of item 11 or 12, wherein,
the power receiving circuit includes
a rectifier circuit, and
a switch circuit which is connected between the rectifier circuit and the electric motor, the switch circuit including the switch.

Item 15. The vehicle of item 12 or 13, wherein,
the power receiving circuit includes
a rectifier circuit,
an impedance matching circuit which is connected between the two reception electrodes and the rectifier circuit, and
a switch circuit which is connected between the two reception electrodes and the impedance matching circuit, or between the impedance matching circuit and the rectifier circuit, the switch circuit including the switch.

Item 16. The vehicle of any of items 1 to 15, wherein the first control circuit increases the impedance of the vehicle as viewed from the power transmitter by sending the power receiving circuit a command to change a value of at least one of resistance, inductance and capacitance of the power receiving circuit.

Item 17. The vehicle of any of items 1 to 16, further comprising the electric motor.

Item 18. The vehicle of any of items 1 to 17, further comprising a detector to detect the at least one of power, voltage and current in the power receiving circuit.

Item 19. The vehicle of any of items 1 to 18, wherein the vehicle is an automated guided vehicle.

Item 20. A wireless power transmission system comprising:
the vehicle of any of items 1 to 19; and
the power transmitter.

Item 21. A wireless power transmission system comprising:
the vehicle of item 6 or 7;
the power transmitter; and
the central controller.

The technique according to the present disclosure is applicable to any device that is driven with electric power. For example, it is applicable to transport robots or electric vehicles, such as automated guided vehicles (AGV) that are used in a factory.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This application is based on Japanese Patent Applications No. 2016-249101 filed Dec. 22, 2016, and No. 2017-219214 filed Nov. 14, 2017, the entire contents of which are hereby incorporated by reference.

What is claimed is:

1. A vehicle for use in a wireless power transmission system including a power transmitter having two transmission electrodes and two or more vehicles to be driven by electric power which is wirelessly transmitted from the power transmitter, the vehicle comprising:
two reception electrodes to receive AC power from the two transmission electrodes through capacitive coupling respectively with the two transmission electrodes;
a power receiving circuit which is connected to the two reception electrodes to convert AC power received by the two reception electrodes into DC power or another form of AC power, and supply the DC power or other form of AC power to an electric motor which drives the vehicle or to a secondary battery which stores electric power for driving the vehicle; and
a control circuit which, while the vehicle is moving, detects another vehicle that is receiving power from the power transmitter by detecting that a value of at least one of power, voltage and current in the power receiving circuit, or a change rate over time thereof, exceeds a threshold value, and performs a control process to increase an impedance of the vehicle as viewed from the power transmitter to suppress decrease in efficiency of power transmission to the other vehicle.

2. The vehicle of claim 1, wherein,
the value of at least one of power, voltage and current in the power receiving circuit, or the change rate over time thereof, is greater than the threshold value when the power transmitter is transmitting power to the another vehicle distinct from the vehicle; and
the value of at least one of power, voltage and current in the power receiving circuit, or the change rate over time thereof, is not greater than the threshold value when the power transmitter is not transmitting power to the another vehicle distinct from the vehicle.

3. The vehicle of claim 1, wherein, while the two reception electrodes are opposed respectively to the two transmission electrodes, if a predetermined amount of time has elapsed before the value of at least one of power, voltage and current in the power receiving circuit, or the change rate over time thereof, exceeds the threshold value, the control circuit requests the power transmitter for power transmission.

4. The vehicle of claim 1, wherein the control circuit includes a motor control circuit which controls the electric motor, and the motor control circuit increases the impedance of the vehicle as viewed from the power transmitter by sending the electric motor a command to stop.

5. The vehicle of claim 4, wherein, after sending the electric motor the command to stop, at the lapse of a predetermined amount of time, the control circuit sends the electric motor a command to start again.

6. The vehicle of claim 4, wherein, after sending the electric motor the command to stop, if the value of at least one of power, voltage and current in the power receiving circuit, or the change rate over time thereof, becomes lower than a threshold value, the control circuit sends the electric motor a command to start again.

7. The vehicle of claim 1, wherein,
the power receiving circuit includes a switch to turn ON or OFF electrical connection between the two reception electrodes and the electric motor; and the control circuit increases the impedance of the vehicle as viewed from the power transmitter by sending the switch a command to turn OFF the electrical connection.

8. The vehicle of claim 7, wherein, after sending the command to the switch, at the lapse of a predetermined amount of time, the control circuit sends the switch a command to turn ON the electrical connection.

9. The vehicle of claim 7, wherein,
the power receiving circuit includes
a rectifier circuit, and
a switch circuit which is connected between the two reception electrodes and the rectifier circuit, the switch circuit including the switch.

10. The vehicle of claim 7, wherein,
the power receiving circuit includes
a rectifier circuit, and
a switch circuit which is connected between the rectifier circuit and the electric motor, the switch circuit including the switch.

11. The vehicle of claim 7, wherein,
the power receiving circuit includes
a rectifier circuit,
an impedance matching circuit which is connected between the two reception electrodes and the rectifier circuit, and
a switch circuit which is connected between the two reception electrodes and the impedance matching circuit, or between the impedance matching circuit and the rectifier circuit, the switch circuit including the switch.

12. The vehicle of claim 1, wherein the control circuit increases the impedance of the vehicle as viewed from the power transmitter by sending the power receiving circuit a command to change a value of at least one of resistance, inductance and capacitance of the power receiving circuit.

13. The vehicle of claim 1, further comprising the electric motor.

14. The vehicle of claim 1, further comprising a detector to detect the at least one of power, voltage and current in the power receiving circuit.

15. The vehicle of claim 1, wherein the vehicle is an automated guided vehicle.

16. A wireless power transmission system comprising:
the vehicle of claim 1; and
the power transmitter.

17. A method of controlling a-vehicles in a wireless power transmission system including a power transmitter having two transmission electrodes and at least a first vehicle and a second vehicle driven by electric power which is wirelessly transmitted from the power transmitter, the first vehicle and the second vehicle each comprising two reception electrodes for receiving AC power from the two transmission electrodes through capacitive coupling respectively with the two transmission electrodes,
the method comprising the steps of:
the first vehicle determining, while the first vehicle is moving with the two reception electrodes being opposed to the two transmission electrodes and the second vehicle is receiving power from the power transmitter, that the second vehicle is receiving power from the power transmitter by detecting that a value of at least one of power, voltage and current in a power receiving circuit connected to the two reception electrodes, or a change rate over time thereof, exceeds a threshold value; and
as a result of the determination that the second vehicle is receiving power from the power transmitter, the first vehicle performing a control process to increase an impedance of the vehicle as viewed from the power transmitter to suppress decrease in efficiency of power transmission to the second vehicle; and
further comprising the steps of:
the first vehicle determining, while the first vehicle is moving with the two reception electrodes being opposed to the two transmission electrodes and the second vehicle not receiving power from the power transmitter, that the second vehicle is not receiving power from the power transmitter by detecting that the value of at least one of power, voltage and current in a power receiving circuit connected to the two reception electrodes, or a change rate over time thereof, does not exceed a threshold value, and as a result of the determination that the second vehicle is not receiving power from the power transmitter, the first vehicle determining whether the first vehicle needs to receive AC power from the power transmitter and requesting the transmitter to transmit AC power if the first vehicle needs to receive the AC power from the power transmitter; and
if the first vehicle needs to receive the AC power, receiving the AC power from the power transmitter by the two reception electrodes, and converting, in the power receiving circuit, the AC power received by the two reception electrodes into DC power or another form of AC power to supply the DC power or other form of AC power to an electric motor which drives the first vehicle or to a secondary battery which stores electric power for driving the first vehicle.

* * * * *